(12) United States Patent
Kimura et al.

(10) Patent No.: US 8,786,065 B2
(45) Date of Patent: Jul. 22, 2014

(54) SUBSTRATE, LIGHT EMITTING DEVICE AND METHOD FOR MANUFACTURING SUBSTRATE

(71) Applicant: Shinko Electric Industries Co., Ltd., Nagano-ken (JP)

(72) Inventors: Yasuyuki Kimura, Nagano (JP); Tadashi Arai, Nagano (JP); Tsuyoshi Kobayashi, Nagano (JP); Toshiyuki Okabe, Nagano (JP)

(73) Assignee: Shinko Electric Industries Co., Ltd., Nagano-ken (JP)

( * ) Notice: Subject to any disclaimer, the term of this patent is extended or adjusted under 35 U.S.C. 154(b) by 0 days.

(21) Appl. No.: 13/667,540

(22) Filed: Nov. 2, 2012

(65) Prior Publication Data

US 2013/0113015 A1 May 9, 2013

(30) Foreign Application Priority Data

Nov. 7, 2011 (JP) .................. 2011-243700

(51) Int. Cl.
*H01L 23/495* (2006.01)
*H01L 33/64* (2010.01)
*H01L 23/00* (2006.01)
*H01L 25/075* (2006.01)

(52) U.S. Cl.
CPC ..... *H01L 33/642* (2013.01); *H01L 2224/45147* (2013.01); *H01L 24/45* (2013.01); *H01L 2924/01047* (2013.01); *H01L 2224/48091* (2013.01); *H01L 25/0753* (2013.01); *H01L 2224/45124* (2013.01); *H01L 2224/73265* (2013.01); *H01L 2224/45144* (2013.01)
USPC .................................. 257/676; 257/E23.042

(58) Field of Classification Search
USPC ................. 257/675, 676, 692, 706, 778, 784, 257/E23.042
See application file for complete search history.

(56) References Cited

U.S. PATENT DOCUMENTS 6,983,537 B2 * 1/2006 Park ................................ 29/840
7,642,137 B2 * 1/2010 Lin et al. ........................ 438/127
7,875,899 B2 * 1/2011 Yasuda ............................ 257/99

FOREIGN PATENT DOCUMENTS

JP 2003-092011 3/2003

* cited by examiner

*Primary Examiner* — Quoc Hoang
(74) *Attorney, Agent, or Firm* — Fish & Richardson P.C.

(57) ABSTRACT

A substrate includes a first lead frame, a second lead frame, and a resin layer. The first lead frame includes a heat sink and a plurality of electrodes for external connection. The second lead frame is laminated on the first lead frame and includes a plurality of wirings for mounting light emitting elements. The resin layer is filled between the first lead frame and the second lead frame. The plurality of wirings are arranged above the heat sink. The plurality of electrodes and part of the plurality of wirings are joined with each other.

17 Claims, 14 Drawing Sheets

SUBSTRATE, LIGHT EMITTING DEVICE AND METHOD FOR MANUFACTURING SUBSTRATE

CROSS-REFERENCE TO RELATED APPLICATIONS

This application is based upon and claims the benefit of priority from prior Japanese Patent Application No. 2011-243700, filed on Nov. 7, 2011, the entire contents of which are incorporated herein by reference.

FIELD

This disclosure relates to a substrate, light emitting device, and a method for manufacturing a substrate.

BACKGROUND

Various light emitting devices have been proposed in the prior art. A light emitting device includes a light emitting element mounted on a substrate. Japanese Laid-Open Patent Publication No. 2003-092011 describes an example of a light emitting device in the related art. In the light emitting device, a wiring pattern is formed on an insulating layer applied to a metal substrate, and a light emitting element such as a light emitting diode (LED) is mounted on the wiring pattern.

In recent years, applications of the light emitting device are expanding to lighting devices and display devices. With such applications, light emitting elements are desired to be mounted at high density. Therefore, refinement of the wiring layer (pitch-narrowing of the wirings) is required. However, since the wiring layer to which the light emitting elements are to be mounted is formed by a subtractive method and the like, making a pitch of the wiring layer narrow is difficult. Further, in the above light emitting devices, heat is generated in the light emitting diodes accompanying electric conduction thereof. This decreases light emitting efficiency of the light emitting diodes. Thus, the wiring layer tends to be formed thick in order to efficiently release the heat that has been generated by the light emitting diodes from the wiring layer. In such a case, the pitch-narrowing of the wirings further becomes difficult.

SUMMARY

One aspect of this disclosure is a substrate including a first lead frame, a second lead frame, and a resin layer. The first lead frame includes a heat sink and a plurality of electrodes for external connection. The second lead frame is laminated on the first lead frame and includes a plurality of wirings for mounting light emitting elements. The resin layer is filled between the first lead frame and the second lead frame. The plurality of wirings are arranged above the heat sink. The plurality of electrodes and part of the plurality of wirings are joined with each other.

Other aspects and advantages of the embodiments will become apparent from the following description, taken in conjunction with the accompanying drawings, illustrating by way of example the principles of the invention.

BRIEF DESCRIPTION OF THE DRAWINGS

The embodiments, together with objects and advantages thereof, may best be understood by reference to the following description of the presently preferred embodiments together with the accompanying drawings in which.

DESCRIPTION OF THE EMBODIMENTS

Embodiments will now be described with reference to the accompanying drawings. The accompanying drawings schematically illustrate structures and do not depict actual scale. To facilitate understanding, cross-sectional views of structures may be illustrated without hatching lines.

One embodiment will now be described with reference to FIGS. 1 to 8.

[Structure of Substrate]

Figure 1A:
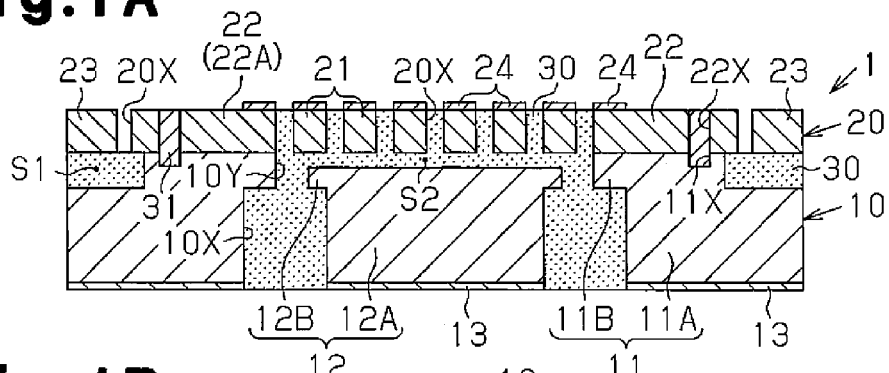
FIG. 1A is a schematic cross-sectional view illustrating a substrate of an embodiment.

As illustrated in FIG. 1A, a substrate 1 includes a first lead frame 10, a second lead frame 20 joined with the first lead frame 10, and a resin layer 30 filled between the first lead frame 10 and the second lead frame 20. In the embodiment, the substrate 1 is adapted to a light emitting device 2 (see FIG. 2A). FIG. 1A illustrates a cross-sectional structure of the substrate 1 at a line A-A position of FIGS. 1B and 1C.

The first lead frame 10 includes a pair of electrodes 11 for external connection that is electrically connected with wirings of a mounting substrate such as a printed wiring board, and a heat sink 12 arranged between the electrodes 11. Copper (Cu), copper-based alloy, ferro-nickel (Fe—Ni), or Fe—Ni-based alloy may be used as a material of the first lead frame 10. The first lead frame 10 is obtained by, for example, etching or stamping a metal plate.

Each electrode 11 includes a base 11A and a connecting portion 11B formed on an upper surface of the base 11A. The connecting portion 11B protrudes toward inside than an inner surface of the base 11A positioned at inside of the substrate 11. An entirety of a lower surface of the base 11A is formed by a metal layer 13.

Examples of the metal layer 13 are a silver (Ag) layer formed of Ag or Ag alloy, and a nickel (Ni) layer formed of Ni or Ni alloy. Other examples of the metal layer 13 are a Ni/gold (Au) layer (a metal layer in which a Ni layer and an Au layer are laminated in this order from the base 11A), and a Ni/palladium (Pd)/Au layer (a metal layer in which a Ni layer, a Pd layer, and an Au layer are laminated in this order from the base 11A). Here, the Au layer is formed of Au or Au alloy, and the Pd layer is formed of Pd or Pd alloy. Further, other examples of the metal layer 13, a Ni/Pd/Ag/Au layer (a metal layer in which a Ni layer, a Pd layer, an Ag layer, and an Au layer are laminated in this order from the base 11A), a Ni/Ag layer (a metal layer in which a Ni layer and an Ag layer are laminated in this order from the base 11A), and a Ni/Pd/Ag layer (a metal layer in which a Ni layer, a Pd layer, and an Ag layer are laminated in this order from the base 11A).

As illustrated in FIG. 1A, the lower surface of the base 11A formed as the metal layer 13 is exposed from a lower surface of the resin layer 30 positioned on a lower surface of the substrate 1. Further, the lower surface of the base 11A is substantially in the same plane as the lower surface of the resin layer 30. That is, a lower surface of the metal layer 13 provided as the lower surface of the base 11A is substantially in the same plane as the lower surface of the resin layer 30. The lower surface of the base 11A is used as a connecting portion with an external substrate. For example, the lower surface of the base 11A serves as a surface that is to be mounted on the mounting substrate such as the printed wiring board. Electric power is supplied to the electrodes 11 via wirings and the like of the mounting substrate from an external power source.

The base 11A includes an outer surface positioned on an outer circumferential surface of the substrate 1. The outer surface of the base 11A is exposed from an outer surface of the resin layer 30 positioned on the outer circumferential surface of the substrate 1. The outer surface of the base 11A is formed to be substantially in the same plane as the outer surface of the resin layer 30.

Figure 1B:
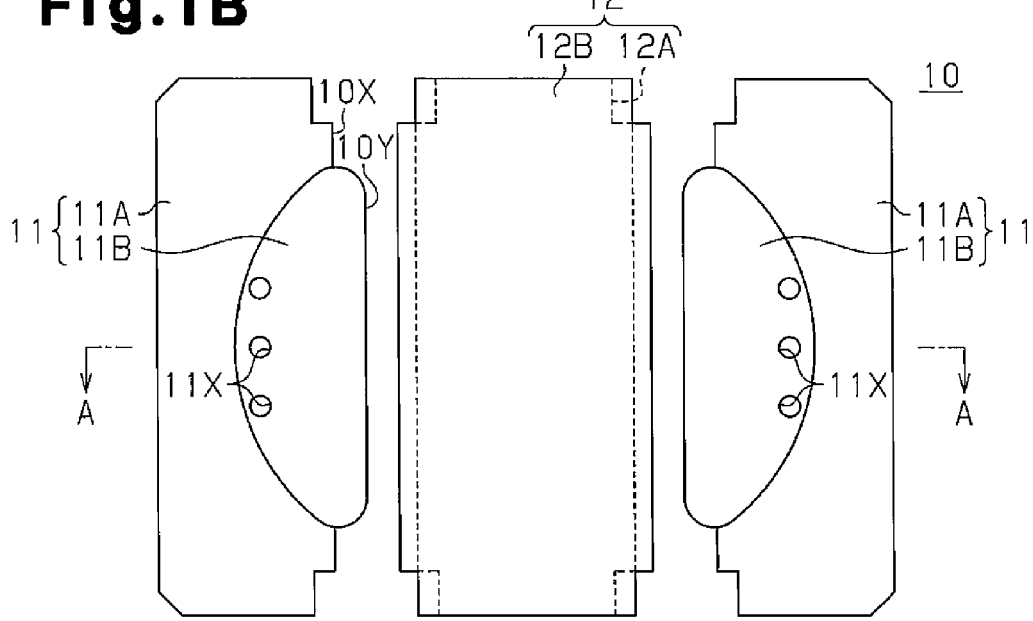
FIG. 1B is a schematic plan view illustrating a first lead frame in the substrate of FIG. 1A.

As illustrated in FIG. 1B, the upper surface of the base 11A is formed in a substantially rectangular shape when viewed from above. The connecting portion 11B is formed in a substantially semi-oval shape when viewed from above. The connecting portion 11B protrudes upward from the upper surface of the base 11A. The connecting portion 11B is formed integrally with the base 11A and is electrically connected with the base 11A. An upper surface of the connecting portion 11B makes contact with a wiring 22 of the second lead frame 20 and is electrically connected with the wiring 22. As illustrated in FIG. 1A, grooves 11X for joining with the second lead frame 20 are formed on the upper surface of the connecting portion 11B. The grooves 11X extend from the upper surface of the connecting portion 11B to midst of the connecting portion 11B in a thickness direction. A space S1 is formed between the base 11A and the second lead frame 20.

The thickness of each electrode 11 (that is, height from the lower surface of the base 11A to the upper surface of the connecting portion 11B) may be approximately 0.4 to 0.8 mm, for example.

The heat sink 12 includes a base 12A and a wide portion 12B formed on an upper surface of the base 12A. The wide portion 12B has a wider width than the base 12A. Similar to the lower surface of the base 11A, an entirety of a lower surface of the base 12A is formed by the metal layer 13. The thickness of the base 12A is substantially the same thickness as the base 11A. On the other hand, the thickness of the wide portion 12B is thinner than the thickness of the connecting portion 11B. Thus, a space S2 is formed between the wide portion 12B and the second lead frame 20.

The thickness of the heat sink 12 (that is, height from the lower surface of the base 12A to the upper surface of the wide portion 12B) may be approximately 0.3 to 0.7 mm, for example. The thickness of the space S2 may be approximately 0.1 to 0.2 mm, for example. As illustrated in FIG. 1B, a planar shape of the wide portion 12B is formed larger than the planar shape of the base 12A.

The heat sink 12 is separated from the respective electrodes 11 by openings 10X formed between the bases 11A and 12A and by openings 10Y formed between the wide portion 12B and the connecting portions 11B. In other words, the openings 10X and 10Y define the electrodes 11 and the heat sink 12.

As illustrated in FIG. 1A, the second lead frame 20 includes a plurality of first wirings 21 (leads), a pair of second wirings 22 (leads), and a frame portion 23 formed on outside of the second wirings 22. Light emitting elements 40 (see FIG. 2A) are mounted on the first wirings 21 and the second wirings 22. The second wirings 22 are electrically connected with the electrodes 11. Copper (Cu), copper-based alloy, ferro-nickel (Fe—Ni), or Fe—Ni-based alloy may be used as a material of the second lead frame 20. The second lead frame 20 is obtained by, for example, etching or stamping a metal plate.

The first wirings 21 are for mounting the light emitting elements 40, and arranged above the heat sink 12. The space S2 is formed between the first wirings 21 and the heat sink 12. Thus, the first wirings 21 and the heat sink 12 are electrically separated.

An upper surface of each first wiring 21 is formed by a metal layer 24. Examples of the metal layer 24 are an Ag layer formed of Ag or Ag alloy, a Ni/Au layer (a metal layer in which a Ni layer and an Au layer are laminated in this order from the first wiring 21), and a Ni/Pd/Au layer (a metal layer in which a Ni layer, a Pd layer, and an Au layer are laminated in this order from the first wiring 21). Here, the Ni layer is formed of Ni or Ni alloy, the Au layer is formed of Au or Au alloy, and the Pd layer is formed of Pd or Pd alloy. Further, other examples of the metal layer 24 are a Ni/Pd/Ag/Au layer (a metal layer in which a Ni layer, a Pd layer, a Ag layer, and an Au layer are laminated in this order from the first wiring 21), a Ni/Ag layer (a metal layer in which a Ni layer and an Ag layer are laminated in this order from the first wiring 21), and a Ni/Pd/Ag layer (a metal layer in which a Ni layer, a Pd layer, and an Ag layer are laminated in this order from the first wiring 21).

As illustrated in FIG. 1A, the upper surfaces of the first wirings 21 formed as the metal layer 24 are exposed from an upper surface of the resin layer 30 positioned on an upper surface of the substrate 1. Further, the upper surfaces of the first wirings 21 are substantially in the same plane as the upper surface of the resin layer 30. The upper surfaces of the first wirings 21 serve as mounting portions for the light emitting elements 40 (see FIG. 2A), and the metal layer 24 is used as a connecting portion with the light emitting elements 40. The metal layer 13 is an example of a first metal layer, and the metal layer 24 is an example of a second metal layer.

Figure 1C:
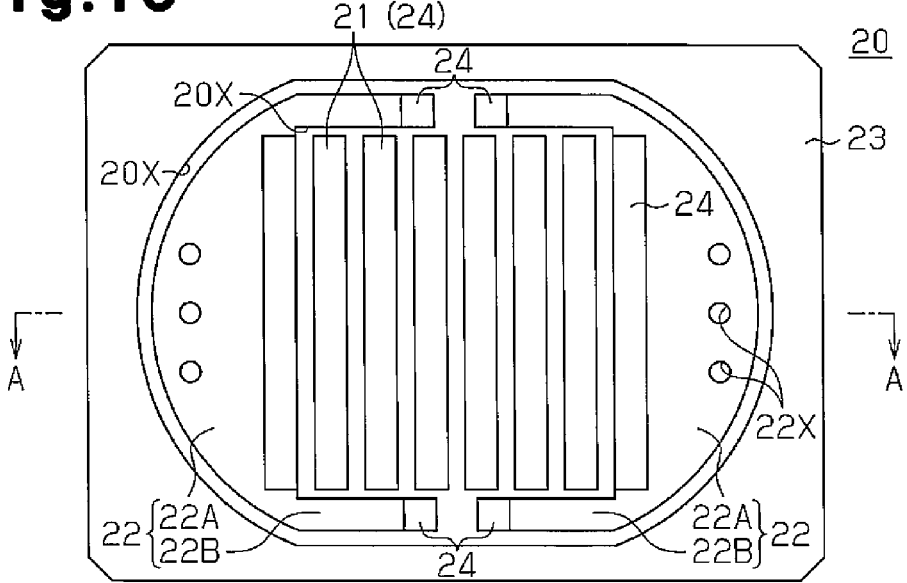
FIG. 1C is a schematic plan view illustrating a second lead frame in the substrate of FIG. 1A.

As illustrated in FIG. 1C, a planar shape of each first wiring 21 is a substantial strip-shape or a rectangular shape. The first wirings 21 are arranged adjacent to one another in parallel at a center portion of the second lead frame 20. The first wirings 21 are electrically separated from one another by an opening 20X of the second lead frame 20.

The pair of second wirings 22 is for mounting the light emitting elements 40. The second wirings 22 surround the first wirings 21. For example, each of the second wirings 22 includes a connecting portion 22A, which is formed in a semi-oval shape when viewed from above, and extended portions 22B, which extend toward inside of the second lead frame 20 from both ends of the connecting portion 22A. In other words, each second wiring 22 is formed in a substantial U-shape when viewed from above. The pair of second wirings 22 is electrically separated from the first wirings 21 by the opening 20X.

As illustrated in FIG. 1A, upper surfaces of the second wirings 22 are exposed from the upper surface of the resin layer 30. Further, the upper surfaces of the second wirings 22 are substantially in the same plane as the upper surface of the resin layer 30.

A metal layer 24 is formed on a part of the upper surface of the connecting portion 22A. The light emitting elements 40 (see FIG. 2A) are mounted on the metal layer 24. The upper surfaces of the second wirings 22 (connecting portions 22A) serve as mounting portions for the light emitting elements 40. That is, the metal layer 24 above the connecting portions 22A is used as a connecting portion with the light emitting elements 40.

Further, openings 22X for connecting with the electrodes 11 are formed in the connecting portions 22A. The openings 22X extend through the second lead frame 20 in a thickness direction, and are communicated with the grooves 11X formed in the connecting portions 11B of the electrodes 11. Joining members 31 are filled in the openings 22X and the grooves 11X. The second wirings 22 are joined with the electrodes 11 by the joining members 31. Further, lower surfaces of the connecting portions 22A of the second wirings 22 make contact with the upper surfaces of the connecting portions 11B of the electrodes 11, and thus the second wirings 22 and the electrodes 11 are electrically connected to each other. Accordingly, the lower surfaces of the second wirings 22 (connecting portions 22A) are used as connecting portions with the electrodes 11.

As illustrated in FIG. 1C, distal ends of the extended portions 22B of one of the second wirings 22 oppose to distal ends of the extended portions 22B of the other second wiring 22. The metal layer 24 is also formed on upper surfaces of the distal ends of the extended portions 22B, similar to the metal layer 24 on the connecting portions 22A. Zener diodes 28 (see FIGS. 2B and 2C) are mounted on the metal layer 24. That is, the extended portions 22B are wirings (leads) for connecting the Zener diodes 28. The metal layer 24 on the extended portions 22B serves as a connecting portion with the Zener diodes 28.

As illustrated in FIG. 1C, the frame portion 23 is formed to surround the first wirings 21 and the second wirings 22. The frame portion 23 is electrically separated from the first wirings 21 and the second wirings 22 by the opening 20X. Further, the space S1 is formed between the frame portion 23 and the electrodes 11. Thus, the frame portion 23 and the electrodes 11 are electrically separated from each other.

As illustrated in FIG. 1A, an upper surface of the frame portion 23 is exposed from the upper surface of the resin layer 30. The upper surface of the frame portion 23 is substantially in the same plane as the upper surface of the resin layer 30. Further, the outer surface of the frame portion 23 positioned on the outer circumferential surface of the substrate 1 is exposed from the outer surface of the resin layer 30, and is substantially in the same plane as the outer surface of the resin layer 30. The frame portion 23 is arranged to support the first wirings 21 and the second wirings 22 in a process for manufacturing the substrate 1.

In this manner, in the second lead frame 20, the first wirings 21, the second wirings 22, and the frame portion 23 are separated from one another by the opening 20X. In other words, the opening 20X defines the first wirings 21, the second wirings 22, and the frame portion 23. The thickness of the first wirings 21, second wirings 22, and frame portion 23 may be approximately 0.1 to 0.25 mm, for example.

As illustrated in FIG. 1A, the resin layer 30 is filled in the space S1 between the electrodes 11 and the frame portion 23 and in the space S2 between the heat sink 12 and the first wirings 21. Further, the resin layer 30 is also filled in the openings 10X and 10Y of the first lead frame 10 and in the opening 20X of the second lead frame 20. That is, the resin layer 30 is formed between the electrodes 11 and the heat sink 12, between the first wirings 21, between the first wirings 21 and the second wirings 22, and between the electrodes 11 and the frame portion 23. Examples of the material for the resin layer 30 are insulating resins such as polyimide-based resin, epoxy-based resin, and silicone-based resin. Another example of the material for the resin layer 30 is a resin material obtained by mixing fillers such as silica or alumina in the insulating resin described above. Further, as the material for the resin layer 30, a white insulating resin may be used. An example of the material for the white insulating resin is a resin material obtained by mixing fillers such as white titanium oxide in the epoxy-based resin or an organo-polysiloxane-based resin. Another example of the material for the white insulating resin is a resin material containing white colorant such as $TiO_2$ or $BaSO_4$.

[Structure of Light Emitting Device]

Figure 2A:
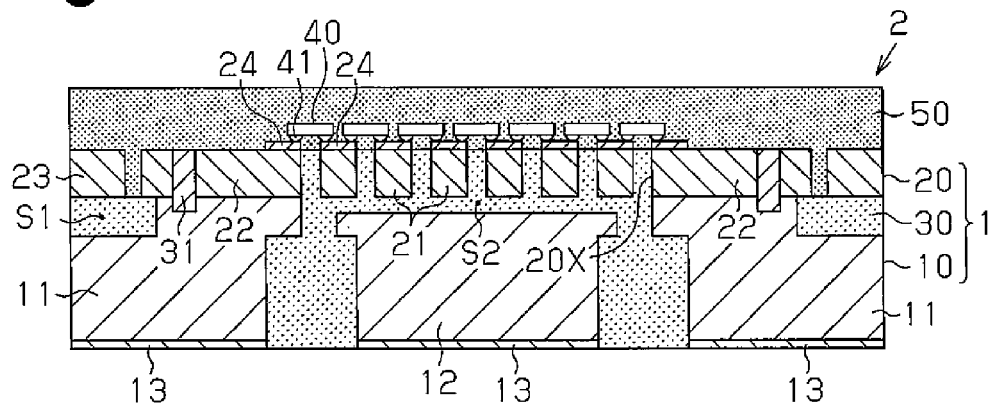
FIG. 2A is a schematic cross-sectional view illustrating a light emitting device provided with the substrate of FIG. 1A.
Figure 2B:
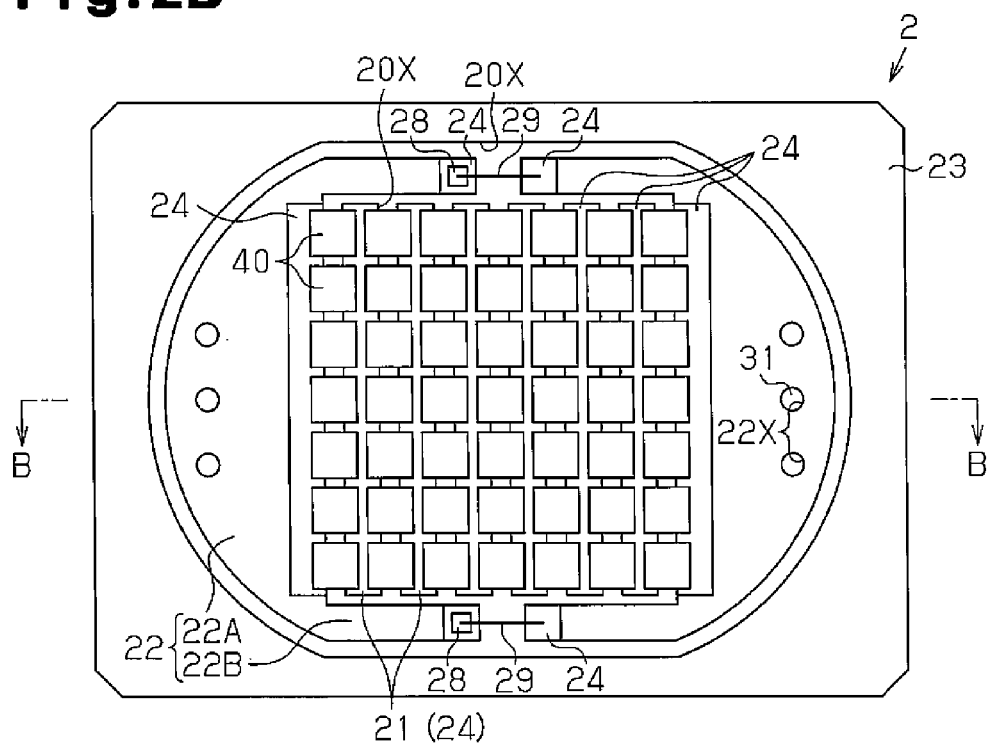
FIG. 2B is a schematic plan view illustrating the light emitting device of FIG. 2A.
Figure 2C:
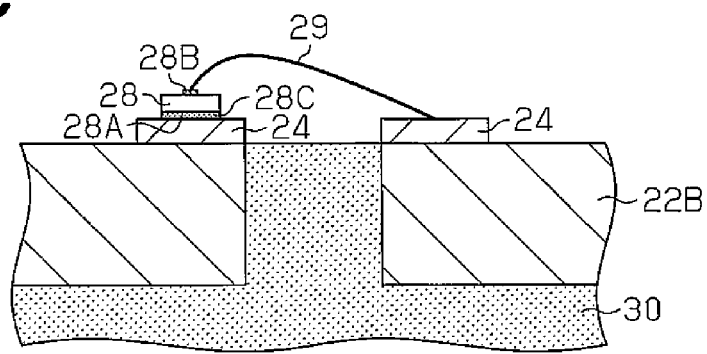
FIG. 2C is a schematic cross-sectional view illustrating a peripheral structure of a Zener diode in the light emitting device of FIG. 2A.

As illustrated in FIG. 2A, the light emitting device 2 includes the substrate 1, the plurality of light emitting elements 40 mounted on the substrate 1, the plurality of Zener diodes 28 mounted on the substrate 1, and an encapsulating resin 50 that encapsulates the light emitting elements 40 and the like. FIG. 2A illustrates a cross-sectional structure of the light emitting device 2 at a line B-B position of FIG. 2B. In FIGS. 2B and 2C, the encapsulating resin 50 illustrated in FIG. 2A is omitted from being depicted. As the light emitting elements 40, for example, light emitting diodes (LED), and vertical cavity surface emitting lasers (VCSEL) may be used. As a light emitting diode, a structure obtained by forming a positive pad and a negative pad on one surface of a light emitting element substrate in which compound semiconductor such as indium gallium nitride (InGaN) is laminated on a monocrystal substrate such as sapphire ($Al_2O_3$) or silicon carbide (SiC) and that has a pn junction structure may be used.

The light emitting elements 40 are mounted on the metal layer 24 formed on the first wirings 21 and the second wirings 22. Each light emitting element 40 is flip-chip-bonded with the metal layer 24 of the first wiring 21 and the metal layer 24 of the second wiring 22 by crossing over the opening 20X, or flip-chip-bonded with the metal layer 24 on two first wirings 21 by crossing over the opening 20X. Here, two bumps 41 are formed on one surface of the light emitting element 40 (a lower surface in FIG. 2A). One of the two bumps 41 is flip-chip-bonded with the metal layer 24 on one of the two wirings, and the other bump 41 is flip-chip-bonded with the metal layer 24 on the other one of the two wirings. Further, as illustrated in FIG. 2B, the light emitting elements 40 are arranged in a matrix (7×7 in FIG. 2B) on the metal layer 24. Therefore, in the light emitting device 2 of the present embodiment, seven pieces of light emitting elements 40 are serially connected between the pair of second wirings 22, and seven groups of the serially connected light emitting elements 40 are connected in parallel. The light emitting elements 40 are connected with the electrodes 11 via the first wirings 21 and the second wirings 22. Further, the light emitting elements 40 illuminate by being supplied with power from an external power source (not illustrated) via the electrodes 11, the second wirings 22, and the like. A planar shape of the light emitting element 40 is, for example, a rectangular shape, and the size thereof is approximately 0.3 to 0.5 $mm^2$, for example.

As the bumps 41, for example, gold bumps and solder bumps may be used. As the material of the solder bumps, for example, an alloy containing lead (Pb), an alloy of tin (Sn) and Au, an alloy of Sn and Cu, an alloy of Sn and Ag, an alloy of Sn, Ag, and Cu and the like may be used.

The Zener diodes 28 are mounted on the metal layer 24 formed on the upper surfaces of the distal ends of the extended portions 22B on one of the second wirings 22. Each Zener diode 28 includes a Zener diode chip lower surface on which an electrode 28A is formed, and a Zener diode chip upper surface on which an electrode 28B is formed. The electrode 28A is formed on the entire Zener diode chip lower surface. Further, as illustrated in FIG. 2C, the Zener diode chip lower surface (electrode 28A) of each Zener diode 28 is joined onto the metal layer 24 via a joining member 28C. Accordingly, the Zener diode chip lower surface (electrode 28A) is electrically connected with the extended portion 22B of one of the second wirings 22. Further, the electrode 28B of the Zener diode chip upper surface is electrically connected with the metal layer 24 formed on the upper surface of the distal end of the opposing extended portion 22B via a bonding wire 29. Accordingly, the Zener diode 28 is mounted between two opposing extended portions 22B. The Zener diodes 28 are mounted for preventing a static breakdown of the light emitting elements 40 such as the light emitting diodes.

As the joining member 28C, for example, silver paste or solder may be used. Further, as the bonding wire 29, for example, an Au wire, an aluminum (Al) wire, or a Cu wire may be used.

As illustrated in FIG. 2A, the encapsulating resin 50 is arranged on the upper surfaces of the second lead frame 20 and the resin layer 30 to encapsulate the light emitting elements 40, the bumps 41, the Zener diodes 28 (not illustrated in FIG. 2A), and the bonding wires 29 (not illustrated in FIG. 2A). An example of the material for the encapsulating resin 50 is a resin material in which silicone resin contains a fluorescent substance. By forming the resin material in which silicone resin contains a fluorescent substance on the light emitting elements 40, the use of a color mixture of the illumination of the light emitting elements 40 and the illumination of the fluorescent substance becomes possible, and thus illuminating colors of the light emitting device 2 may be controlled with variety.

In the present embodiment, the substrate 1 is formed by joining the first lead frame 10, which includes the pair of electrodes 11, and the second lead frame 20, which includes the first and second wirings 21 and 22 as mounting regions for the light emitting elements 40. That is, the first lead frame 10 and the second lead frame 20 are joined after the first lead frame 10 and the second lead frame 20 are independently manufactured. Therefore, in manufacturing the second lead frame 20, processing on both surfaces of the second lead frame 20 becomes possible. Therefore, pitch-narrowing (refining) of the first wirings 21 and the second wirings 22 may be performed than in the conventional light emitting device in which the etching of only one surface can be performed by the subtractive method. Specifically, in the case of forming a wiring layer by the subtractive method, a cross-sectional shape of the wiring layer becomes a trapezoid shape by a side-etching phenomenon in which the etching progresses in an in-plane direction of the wiring layer. Therefore, when the pitch of wirings becomes narrow as the wiring layer becomes thicker, a space between the wirings becomes difficult to secure. In contrast, in the case of forming the first wirings 21 and the second wirings 22 of the second lead frame 20, etching processing may be performed from both surfaces of the metal plate that is to be the second lead frame 20. According to such etching processing, even if the thickness of the first wirings 21 and the second wirings 22 become thick, a space (for example, 105 μm) corresponding to the thickness (for example, 105 μm) may easily be secured. Therefore, the pitch of the first wirings 21 and the second wirings 22 may be narrowed.

[Method for Manufacturing Substrate]

A method for manufacturing the substrate 1 will now be described with reference to FIGS. 3 to 7.

Figure 3A:
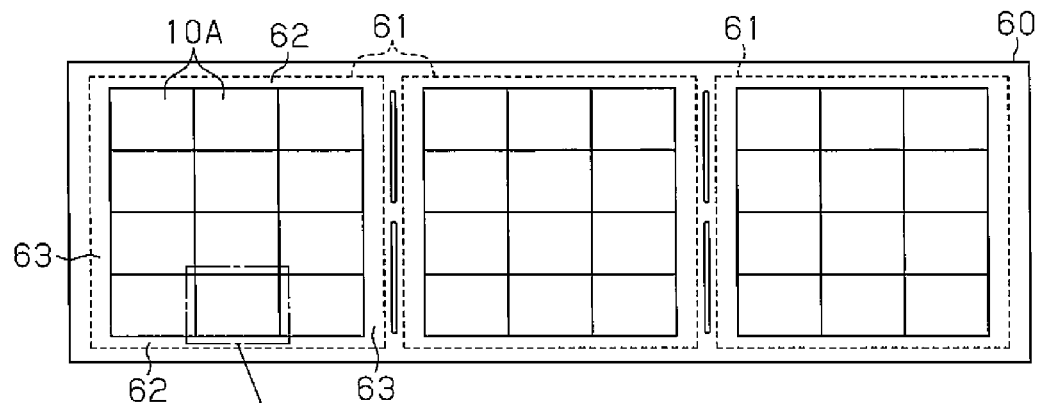
FIG. 3A is a schematic plan view illustrating a method for manufacturing the substrate of FIG. 1A.
Figure 3B:
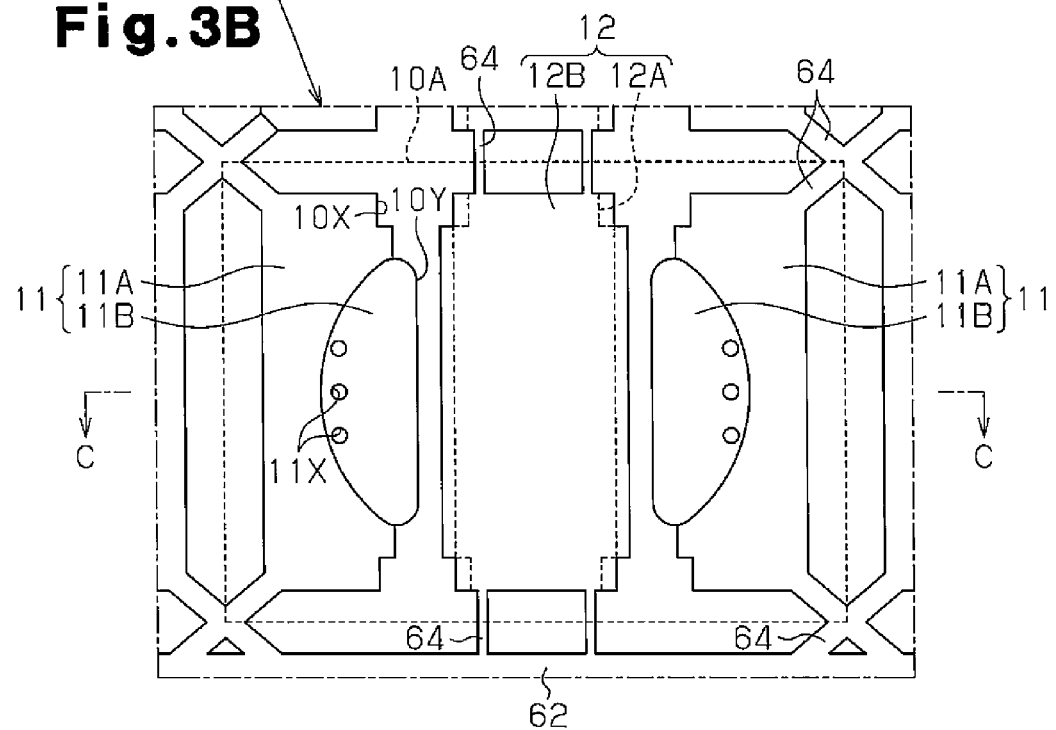
FIG. 3B is an enlarged plan view of a unit lead frame illustrating a part of FIG. 3A.
Figure 3C:
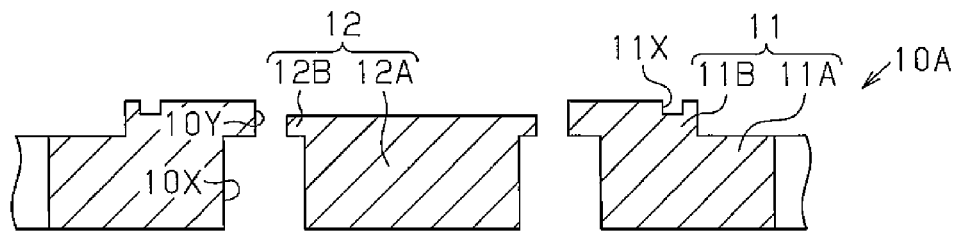
FIG. 3C is a schematic cross-sectional view of the unit lead frame at a line C-C position of FIG. 3B.

First, in the step illustrated in FIGS. 3A to 3C, the metal plate is stamped, or both surfaces of the metal plate are etched to form a substrate frame 60. As schematically illustrated in FIG. 3A, a plurality (three in FIG. 3A) of resin filling regions 61 are separately defined on one surface of the substrate frame 60. In each resin filling region 61, a plurality of unit lead frames 10A, each corresponding to the first lead frame 10, is formed consecutively in a matrix (4×3 in FIG. 3A). In each resin filling region 61, 4×3 unit lead frames 10A are supported by a pair of rail portions 62 extending in a longitudinal direction (left and right direction in FIG. 3A) and a pair of rail portions 63 extending in a width direction (up and down direction in FIG. 3A). As illustrated in FIG. 3B, the pair of electrodes 11 and the heat sink 12 are defined in each unit lead frame 10A. The pair of electrodes 11 and the heat sink 12 in each unit lead frame 10A are either connected respectively to the pair of electrodes 11 and the heat sink 12 in an adjacent unit lead frame 10A, or connected to the rail portions 62 and 63 by tie-bars 64. Further, as illustrated in FIG. 3C, in each unit lead frame 10A, the grooves 11X are formed in the connecting portions 11B of the electrodes 11. In a resin filling step that is a post-processing step, resin filling is performed for each resin filling region 61 by a collective molding scheme.

Figure 4A:
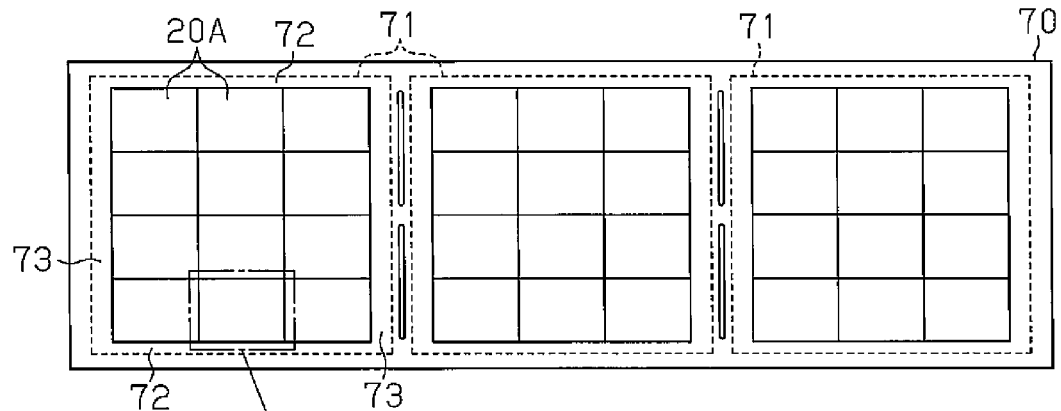
FIG. 4A is a schematic plan view illustrating the method for manufacturing the substrate of FIG. 1A.
Figure 4B:
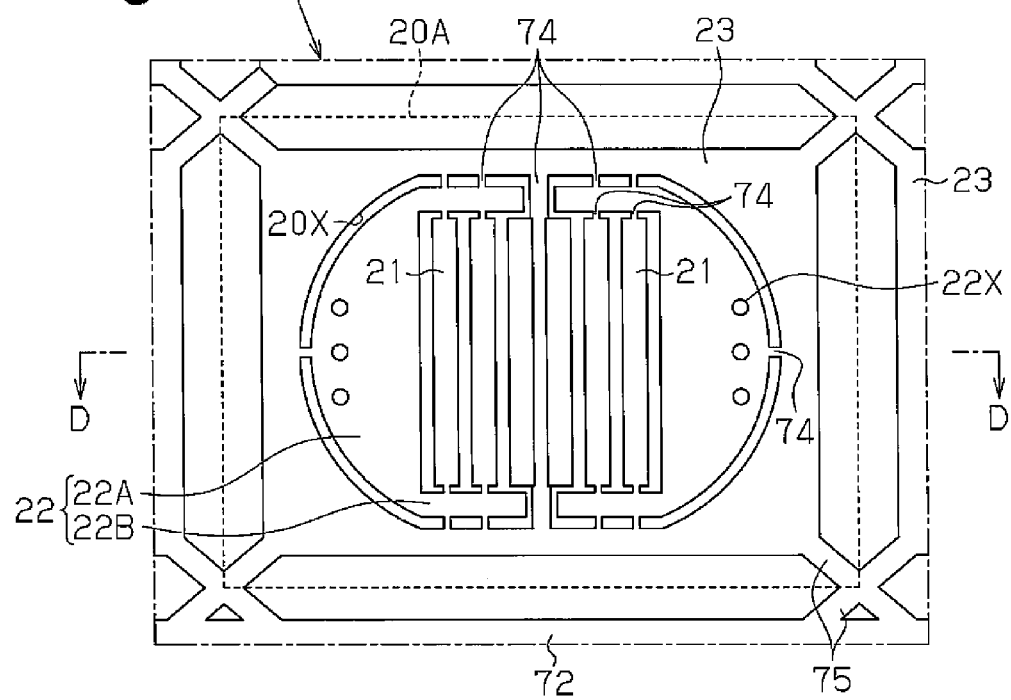
FIG. 4B is an enlarged plan view of a unit lead frame illustrating a part of FIG. 4A.
Figure 4C:
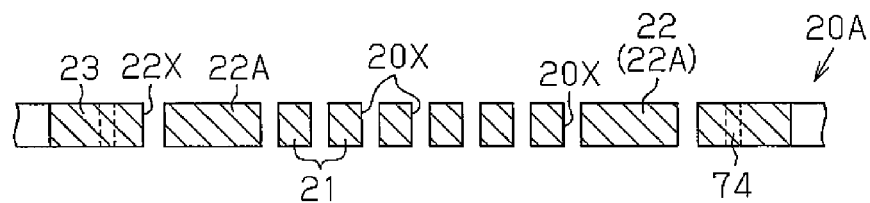
FIG. 4C is a schematic cross-sectional view of the unit lead frame at a line D-D position of FIG. 4B.

In the step illustrated in FIGS. 4A to 4C, the metal plate is stamped, or both surfaces of the metal plate are etched to form a substrate frame 70. As schematically illustrated in FIG. 4A, a plurality (three in FIG. 4A) of frame regions 71 are separately defined on one surface of the substrate frame 70. In each frame region 71, a plurality of unit lead frames 20A, each corresponding to the second lead frame 20, are formed consecutively in a matrix (4×3 in FIG. 4A). Further, in each frame region 71, 4×3 unit lead frames are supported by a pair of rail portions 72 extending in the longitudinal direction (left and right direction in FIG. 4A) and a pair of rail portions 73 extending in the width direction (up and down direction in FIG. 4A). The first wirings 21, the second wirings 22, and the frame portion 23 are defined in each unit lead frame 20A. Further, in each unit lead frame 20A, coupling portions 74 that electrically and mechanically connect the first wirings 21, the second wirings 22, and the frame portion 23 to one another are defined. The coupling portions 74 connect the first wirings 21 to the extended portions 22B of the second wirings 22 and connect the second wirings 22 to the frame portion 23. The frame portion 23 in each unit lead frame 20A is either connected to the frame portion 23 of an adjacent unit lead frame 20A by tie-bars 75, or connected to the rail portions 72 and 73 by tie-bars 75. Further, as illustrated in FIG. 4C, in each unit lead frame 20A, the openings 22X are formed in the connecting portions 22A of the second wirings 22.

Figure 5A:
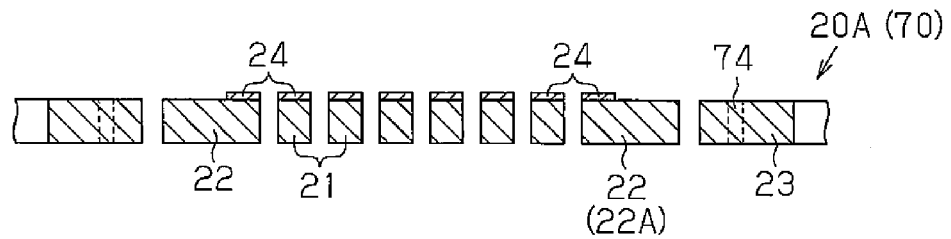
FIG. 5A is a schematic cross-sectional view of the substrate at the line D-D position of FIG. 4B illustrating the method for manufacturing the substrate of FIG. 1A.

Next, in the step illustrated in FIG. 5A, the metal layer 24 is formed on the entire upper surface of each first wiring 21 and a part of the upper surface of each second wiring 22 in each unit lead frame 20A. For example, by a partial plating device, the metal layer 24 is formed by masking portions where formation of the metal layer 24 is not needed and performing electrolytic plating using the substrate frame 70 as a power supplying layer on an upper surface of the substrate frame 70.

Figure 5B:
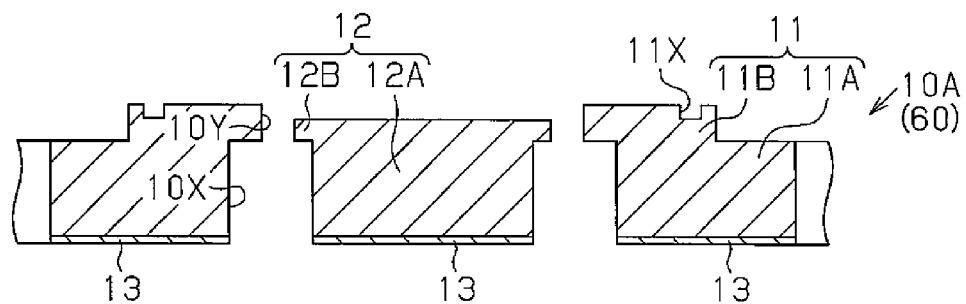
FIG. 5B is a schematic cross-sectional view of the substrate at the line C-C position of FIG. 3B illustrating the method for manufacturing the substrate of FIG. 1A.

Next, in the step illustrated in FIG. 5B, the metal layer 13 is formed on an entire lower surface of the substrate frame 60, that is, the entire lower surfaces of the bases 11A of the electrodes 11 and the entire lower surface of the base 12A of the heat sink 12. For example, by the partial plating device, the metal layer 13 is formed by masking portions where formation of the metal layer 13 is not needed, and performing electrolytic plating using the substrate frame 60 as the power supplying layer on the lower surface of the substrate frame 60.

Figure 5C:
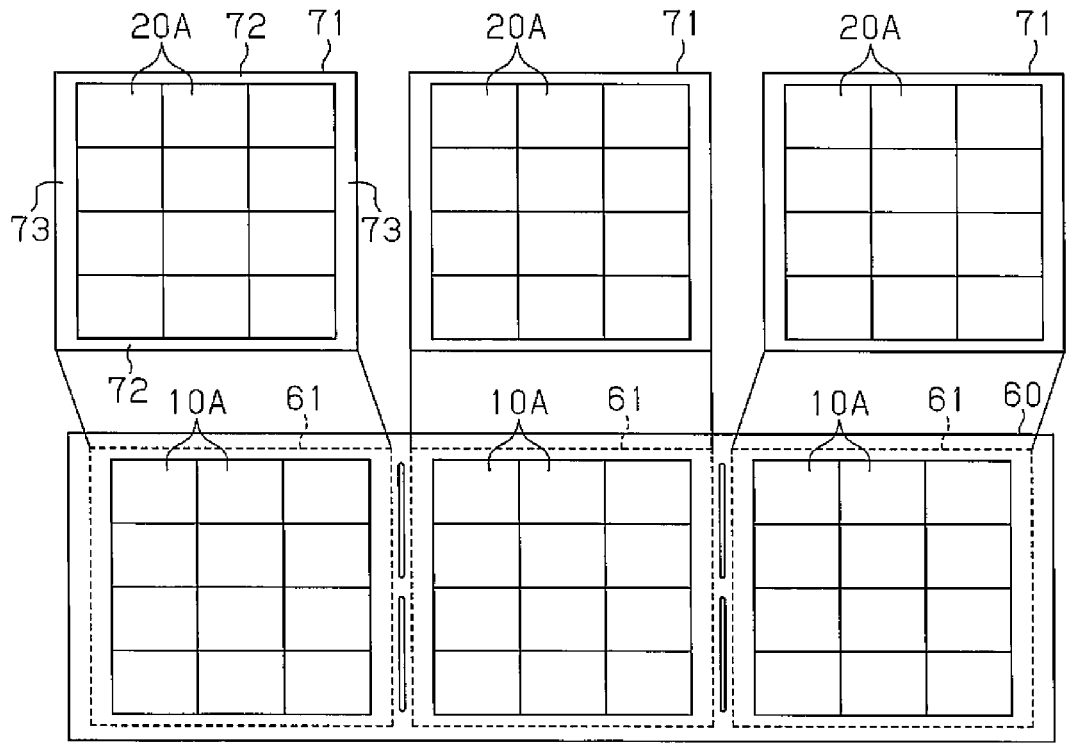
FIG. 5C is a schematic plan view illustrating the method for manufacturing the substrate of FIG. 1A.

Subsequently, in the step illustrated in FIG. 5C, the substrate frame 70 illustrated in FIG. 4A is separated into respective frame regions 71 by cutting the substrate frame 70 using a dicer, a router, or a punching die, and the cut frame region 71 is laminated on the corresponding resin filling region 61 of the substrate frame 60. That is, the 4×3 pieces of unit lead frames 20A are laminated on the corresponding 4×3 pieces of unit lead frames 10A.

Figure 6A:
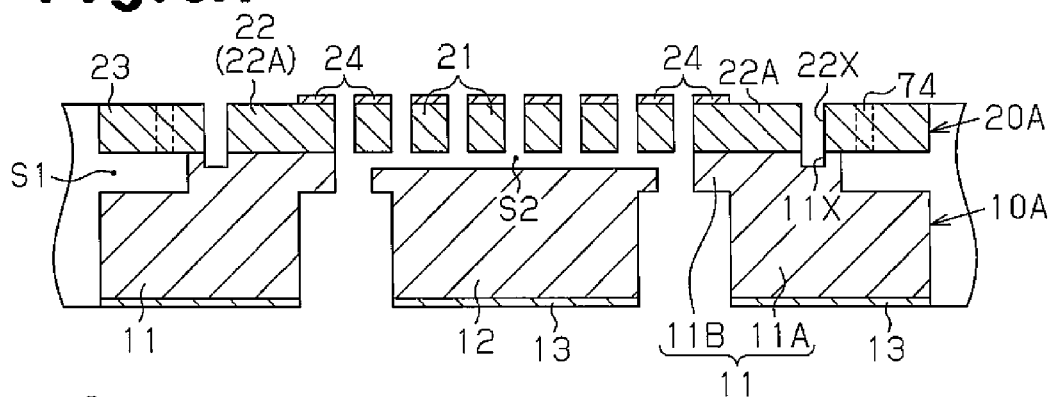
FIGS. 6A to 6D are schematic cross-sectional views of the substrate at the line C-C position of FIG. 3B and the line D-D position of FIG. 4B illustrating the method for manufacturing the substrate of FIG. 1A.
Figure 6B:
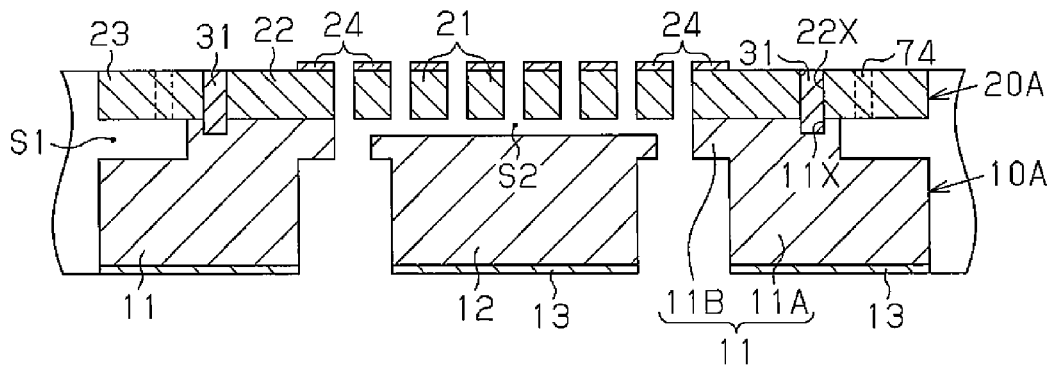

In this step, as illustrated in FIG. 6A, each unit lead frame 20A is positioned on the corresponding unit lead frame 10A so that the openings 22X of each unit lead frame 20A communicate with the grooves 11X of each unit lead frame 10A and the lower surfaces of the connecting portions 22A of the second wirings 22 come to contact with the upper surfaces of the connecting portions 11B of the electrodes 11. At this time, the first wirings 21 come to be arranged above the heat sink 12. Here, the first wirings 21 and the second wirings 22 are supported by the frame portion 23 via the coupling portions 74, and the frame portion 23 is supported by the rail portions 72 and 73 via the tie-bars 75 (see FIG. 4B). Therefore, when the connecting portions 22A of the second wirings 22 and the connecting portions 11B of the electrodes 11 make contact, the space S1 is formed between the frame portion 23 and the bases 11A of the electrodes 11. Further, the space S2 is formed between the first wirings 21 and the heat sink 12. Next, as illustrated in FIG. 6B, the electrodes 11 and the second wirings 22 are joined by forming solder joints. For example, the electrodes 11 and the second wirings 22 are joined by mounting soldering balls on the openings 22X and the grooves 11X (or the soldering balls may be inserted therein) and thereafter performing reflow. Thus, each unit lead frame 20A is laminated on the corresponding unit lead frame 10A. Further, the joining member 31 (which is solder herein) is filled in the openings 22X and the grooves 11X. In the case of joining the second wirings 22 and the connecting portions 11B with solder (joining member 31), the metal layer 13 is formed on inner surfaces of the grooves 11X and the metal layer 24 is formed on inner surfaces of the openings 22X upon respectively forming the metal layers 13 and 24 on the substrate frames 60 and 70. This may satisfactorily form the connection between the second wirings 22 and the electrodes 11. That is, since wetting of the solder improves due to the metal layer 13 formed on the inner surfaces of the grooves 11X and the metal layer 24 formed on the inner surfaces of the openings 22X, the mutual joints between the second wirings 22 and the electrodes 11 may be formed satisfactorily.

Figure 6C:
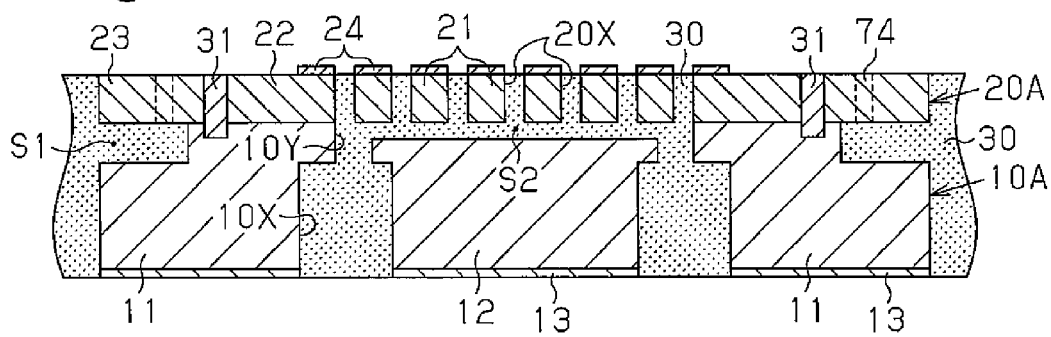

Next, in the step illustrated in FIG. 6C, the resin layer 30 is formed in the spaces S1 and S2 between the unit lead frame 10A and the unit lead frame 20A, the openings 10X and 10Y of the unit lead frame 10A, and the opening 20X of the unit lead frame 20A by the collective molding scheme. Although not illustrated, in this step, the structure body illustrated in FIG. 6B may for example be mounted on a lower mold, and the structure body is sandwiched from above by an upper mold. Then, the structure body of FIG. 6B is heated and pressurized while injecting insulating resin in the corresponding resin filling region 61 (see FIG. 5C) from a mold gate portion (not illustrated). This resin layer 30 is molded resin formed for example by a transfer molding method, a compression molding method, an injection molding method and the like.

Figure 6D:
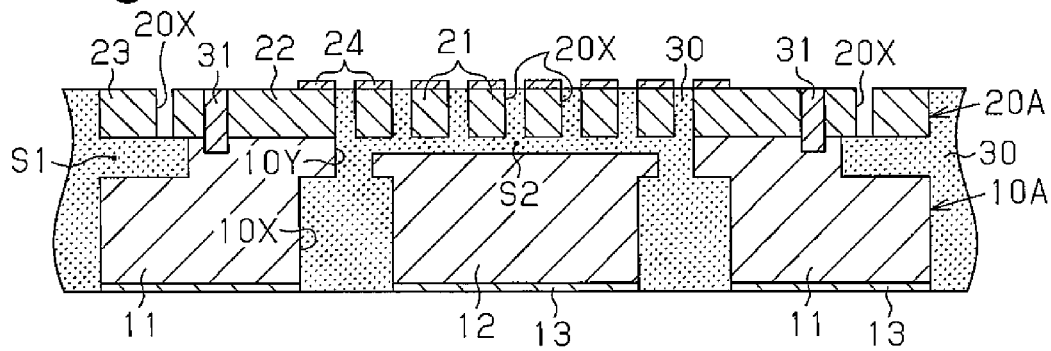
Figure 7A:
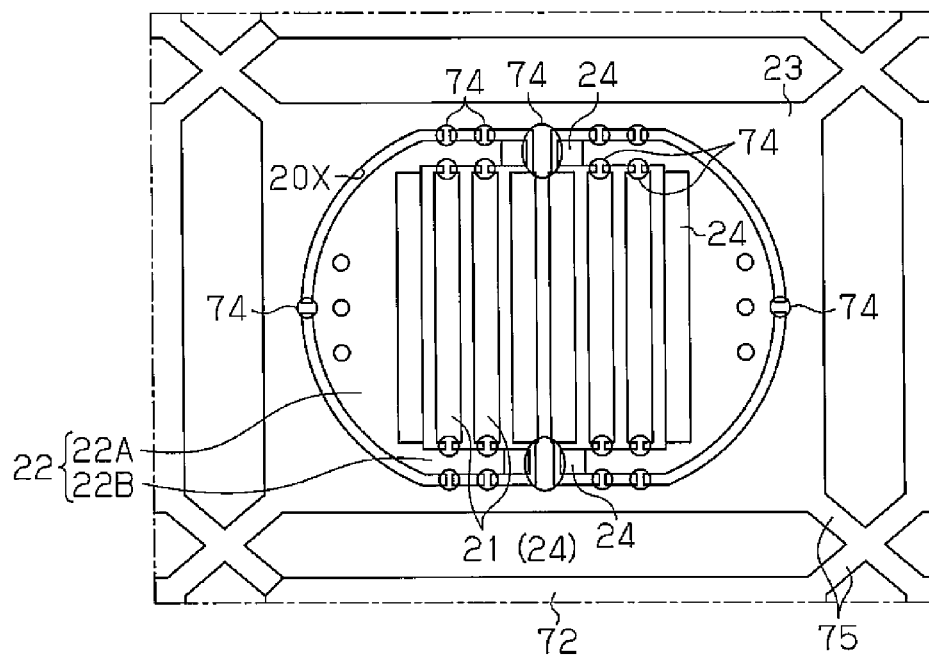
FIGS. 7A and 7B are enlarged plan views illustrating the method for manufacturing the substrate of FIG. 1A.
Figure 7B:
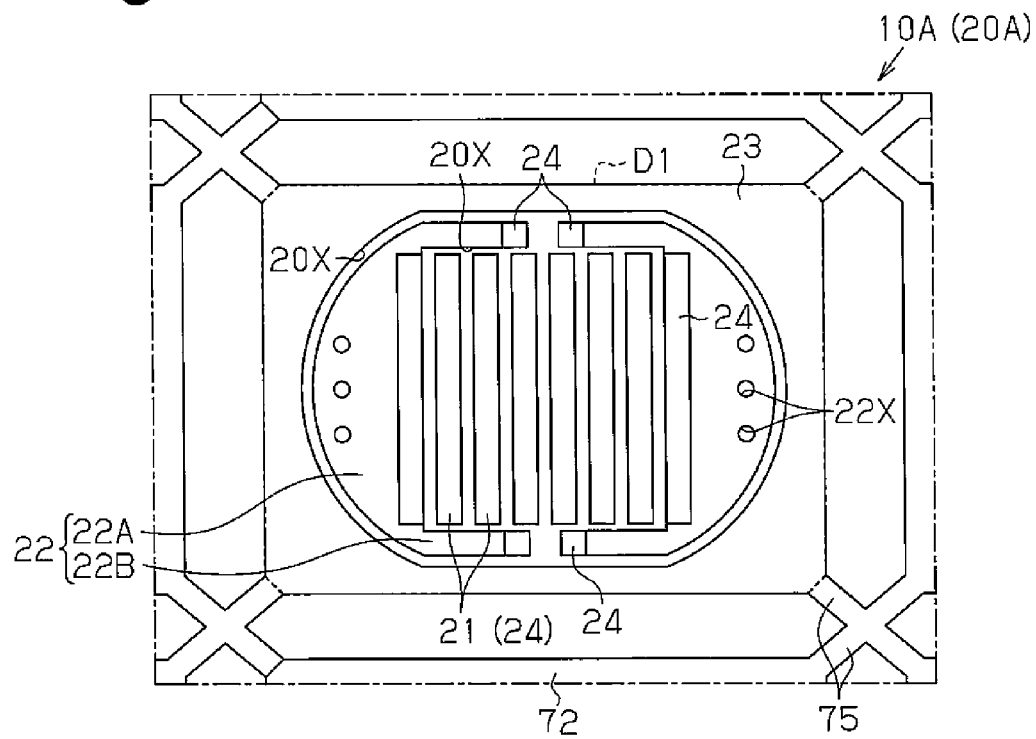

Next, in the step illustrated in FIG. 6D, the coupling portions 74 illustrated in FIG. 6C are removed. That is, as illustrated in FIG. 7A, the coupling portions 74 (see round frames in FIG. 7A) connecting the first wirings 21, the second wirings 22, and the frame portion 23 to one another are removed. Therefore, as illustrated in FIG. 7B, the first wirings 21 and the second wirings 22 are separated from the frame portion 23, the first wirings 21 and the second wirings 22 are separated from each other, and the plurality of first wirings 21 are separated. The removal of the coupling portions 74 may be performed for example by cutting performed by router processing, laser processing, and dicer.

According to the above manufacturing steps, the structure body corresponding to the substrate 1 is formed on each unit lead frame 10A.

Figure 8A:
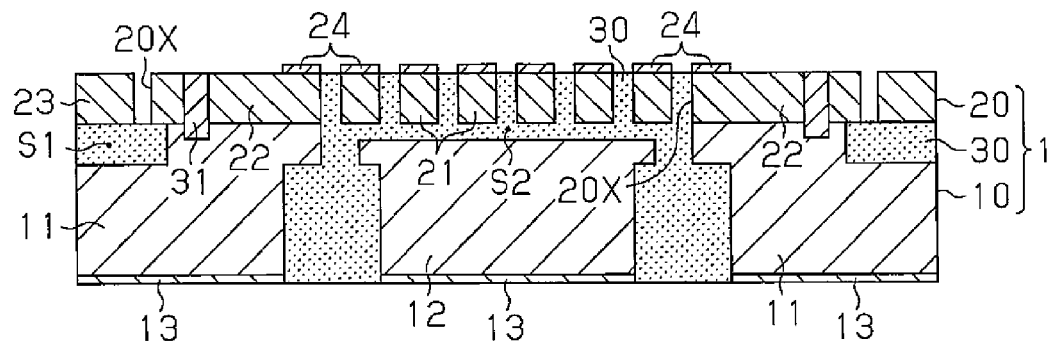
FIGS. 8A and 8B are schematic cross-sectional views of the substrate at a line A-A position of FIGS. 1B and 1C illustrating the method for manufacturing the substrate of FIG. 1A.

Next, the structure body illustrated in FIG. 7B is cut along dicing positions D1 (see broken lines) by the dicer, router, and the like. Therefore, as illustrated in FIG. 8A, the structure body of FIG. 7B is formed into separate pieces of substrates 1, and a plurality of substrates 1 are manufactured. By the cutting at this time, the tie-bars 75 illustrated in FIG. 7B and the resin layer 30 formed outside the frame portion 23 are removed from the substrate 1.

[Method for Manufacturing Light Emitting Device]

Figure 8B:
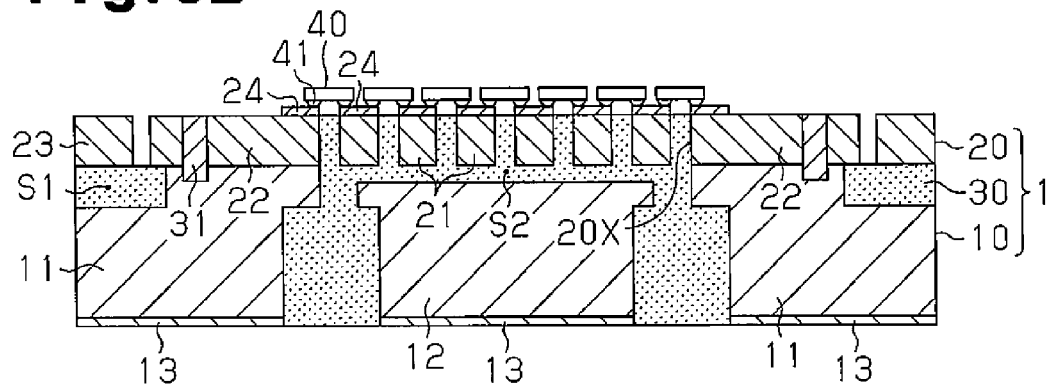

In the step illustrated in FIG. 8B, the light emitting elements 40 are mounted on the metal layer 24 formed on the upper surfaces of the first and second wirings 21 and 22 of the substrate 1. In the present embodiment, the bumps 41 of the light emitting elements 40 are flip-chip-bonded on upper surfaces of the metal layers 24 on the adjacent wirings (wirings 21 and 22, or wirings 21). For example, in a case where the bumps 41 are gold bumps, the gold bumps 41 are bonded by ultrasonic bonding on the metal layers 24.

Further, although not illustrated, the Zener diodes 28 (see FIGS. 2B and 2C) are mounted on the extended portions 22B of the second wirings 22 of the substrate 1. In the present embodiment, the Zener diodes 28 are bonded on the metal layers 24 formed by the joining member 28C on the upper surfaces of the distal ends of the extended portions 22B. Further, the electrodes 28B on the Zener diode chip upper surfaces are electrically connected with the opposing extended portions 22B by wire-bonding.

Figure 8C:
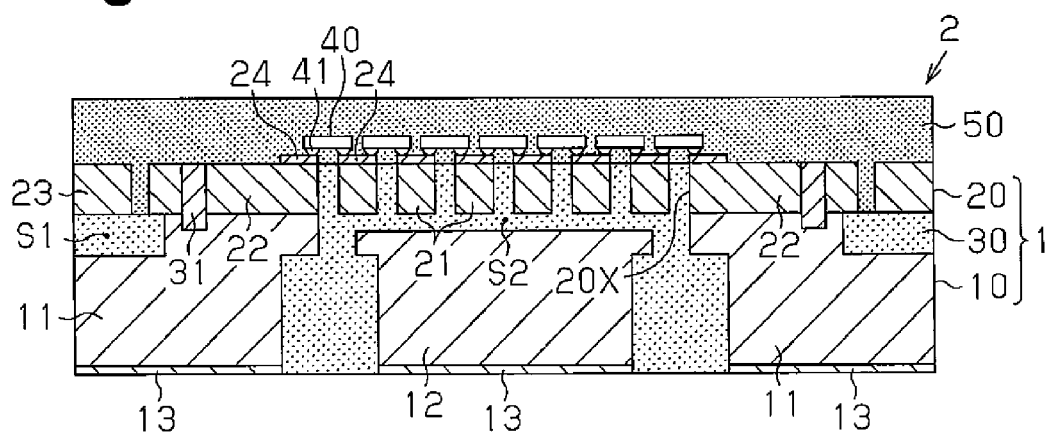
FIG. 8C is a schematic cross-sectional view of the light emitting device at a line B-B position of FIG. 2B illustrating the method for manufacturing the light emitting device of FIG. 2A.

Next, in the step illustrated in FIG. 8C, the encapsulating resin 50 that encapsulates the plurality of light emitting elements 40, the bumps 41, the Zener diodes 28, and the bonding wires 29 (see FIG. 2C) mounted on the substrate 1 is formed. For example, in a case of using thermosetting resin as the encapsulating resin 50, the structure body illustrated in FIG. 8B is housed in a mold, pressure (for example, 5 to 10 MPa) is applied to the mold, and fluidized resin is introduced in the mold. Thereafter, the encapsulating resin 50 is formed for example by heating the resin at approximately 180° C., and setting the same. The encapsulating resin 50 may be formed by potting liquid resin. According to the above manufacturing steps, the light emitting device 2 illustrated in FIG. 2A is manufactured.

The present embodiment has the advantages described below.

(1) The pitch-narrowing of the first wirings 21 and the second wirings 22 is possible even if the first wirings 21 and the second wirings 22 are thick. Therefore, a large number of light emitting elements 40 may be mounted at high density. Further, by forming the first wirings 21 and the second wirings 22 thick, heat generated from the light emitting elements 40 may be released effectively from the first wirings 21 and the second wirings 22. This suppresses temperature increase in the light emitting elements 40 and thus suppresses reduction of light emitting efficiency of the light emitting diodes 40 in a suitable manner.

(2) By joining the second wirings 22 and the electrodes 11 with each other, the second wirings 22 and the electrodes 11 are formed as electrodes that extend from the upper surface of the substrate 1 onto which the light emitting elements 40 are mounted to the lower surface of the substrate 1. In this structure, the heat generated from the light emitting elements 40 may also be released by the electrodes 11. Therefore, the heat discharging efficiency may further be improved. Further, by directly connecting the electrodes 11 to the wiring layers of the mounting substrate, power may be supplied to the light emitting elements 40. Therefore, compared to a case of electrically connecting the electrodes of the substrate 1 and the mounting substrate by wire-bonding, the light emitting device 2 is made smaller.

(3) The heat sink 12 is arranged between the pair of electrodes 11. Thus, the heat sink 12 may efficiently release the heat from the light emitting elements 40. Therefore, the reduction of the light emitting efficiency of the light emitting diodes 40 may more suitably be suppressed.

(4) The first lead frame 10 and the second lead frame 20 may be manufactured independently. Therefore, materials of the first lead frame 10 and the second lead frame 20 may be selected independently, and thus the substrate 1 may be adapted to a wide variety of applications.

(5) The coupling portions 74, which connect the first wirings 21, the second wirings 22, and the frame portion 23, and the tie-bars 75, which connect the frame portion 23 to the rail portions 72 and 73, are formed in the unit lead frame 20A. Therefore, the unit lead frame 20A may easily be laminated on the unit lead frame 10A.

It should be apparent to those skilled in the art that the aforementioned embodiments may be embodied in many other specific forms without departing from the spirit or scope of the invention. Particularly, it should be understood that the invention may be embodied in the following forms.

Figure 9A:
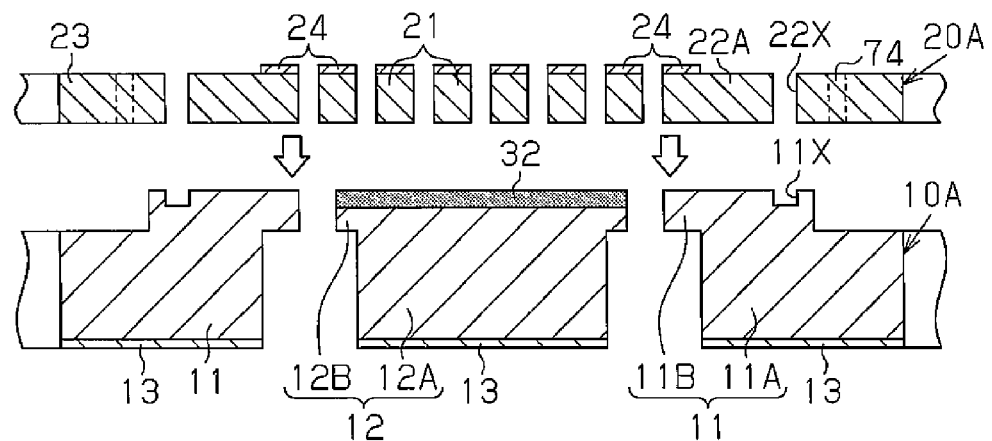
FIGS. 9A to 9C are schematic cross-sectional views illustrating a method for manufacturing a substrate of a modified example.
Figure 9B:
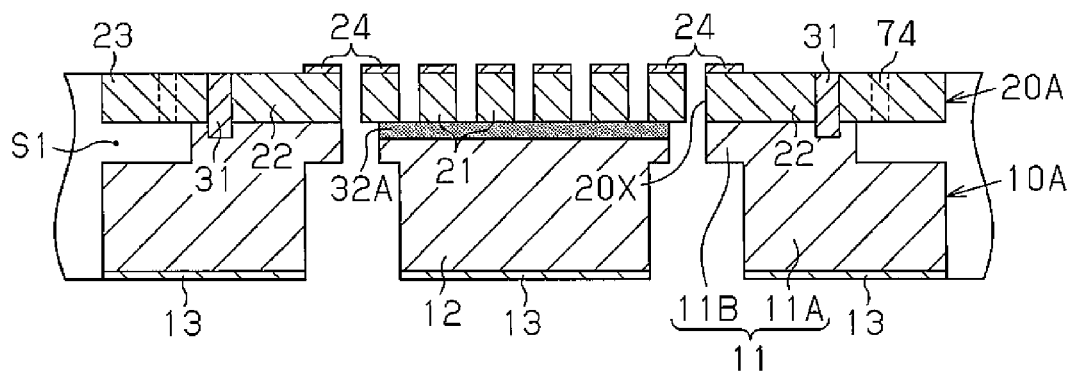
Figure 9C:
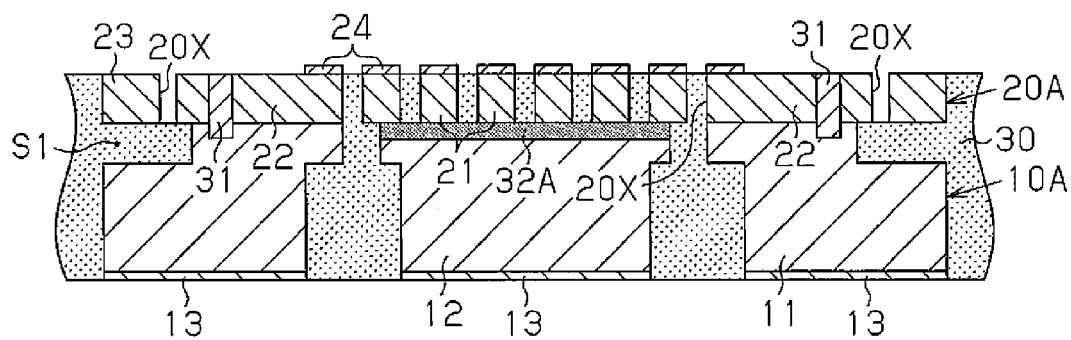

In the above embodiment, the step of laminating the unit lead frame 20A on the unit lead frame 10A may be changed to steps illustrated in FIGS. 9A to 9C. As illustrated in FIG. 9A, first, an adhering film 32 is adhered on the wide portion 12B of the heat sink 12 in each unit lead frame 10A. As the adhering film 32, an adhering film formed of insulating resin such as polyimide-based resin and epoxy-based resin may be used.

Further, in the step illustrated in FIG. 9A, each unit lead frame 20A is arranged above the corresponding unit lead frame 10A so that the openings 22X of each unit lead frame 20A oppose to the grooves 11X of the unit lead frame 10A, and that the first wirings 21 oppose to the adhering film 32.

Subsequently, in the step illustrated in FIG. 9B, the unit lead frames 10A and 20A are heated and pressurized from both sides at a temperature of approximately 190 to 250° C. According to this, as illustrated in FIG. 9B, the adhering film 32 is set, and an insulating layer 32A is formed between the first wirings 21 and the heat sink 12. Further, in accompanying the setting of the adhering film 32, the first wirings 21 and the heat sink 12 are adhered to each other by the adhering film 32. According to this, the unit lead frame 10A and the unit lead frame 20A are adhered to each other. At this occasion, the openings 22X communicate with the grooves 11X, and the lower surfaces of connecting portions 22A of the second wirings 22 make contact with the upper surfaces of the connecting portions 11B of the electrodes 11.

Further, in the step illustrated in FIG. 9B, the soldering balls are mounted on the openings 22X and the grooves 11X, and the electrodes 11 and the second wirings 22 are bonded to each other by solder bonding by thereafter performing reflow. According to this, the unit lead frame 20A is bonded strongly onto the unit lead frame 10A.

Next, in the step illustrated in FIG. 9C, the resin layer 30 is formed in the spaces S1 between the unit lead frame 10A and the unit lead frame 20A, the openings 10X and 10Y of the unit lead frame 10A, and the opening 20X of the unit lead frame 20A by the collective molding scheme. Thereafter, the coupling portions 74 illustrated in FIG. 9B are removed.

According to a manufacturing method as above, the first wirings 21 and the heat sink 12 are adhered to each other by the adhering film 32 in addition to the solder bonding. Therefore, joint strength of the unit lead frames 10A and 20A may be increased. Further, upon laminating the unit lead frame 20A on the unit lead frame 10A, occurrences of warping and deformation of the plurality of first wirings 21 may suitably be suppressed.

Figure 10A:
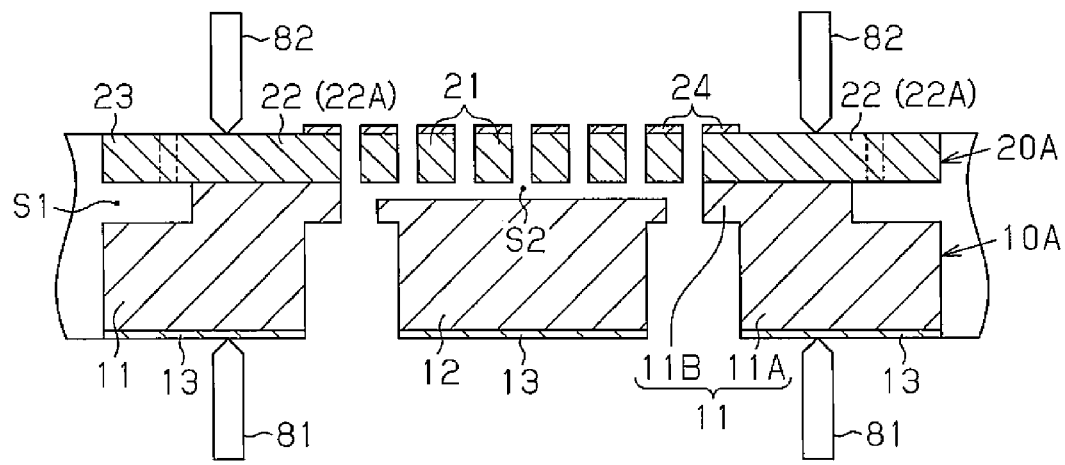
FIGS. 10A and 10B are schematic cross-sectional views illustrating a method for manufacturing a substrate of a modified example.
Figure 10B:
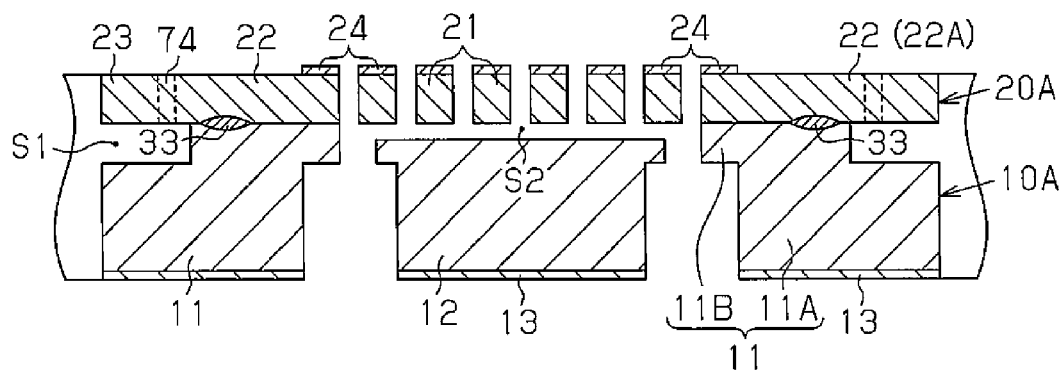

In the above embodiment and the above modified example, the second wirings 22 are joined with the electrodes 11 by solder bonding. As an alternative thereof, the second wirings 22 may be joined with the electrodes 11 for example by resistance welding, ultrasonic bonding and the like. FIGS. 10A and 10B illustrate a method of joining the second wirings 22 to the electrodes 11 by the resistance welding. Firstly, as illustrated in FIG. 10A, each unit lead frame 20A is positioned on the corresponding unit lead frame 10A so that the lower surfaces of the connecting portions 22A of each unit lead frame 20A make contact with the upper surfaces of the connecting portions 11B of the electrodes 11, and the first wirings 21 oppose to the heat sink 12. Subsequently, distal end surfaces of first welding electrodes 81 are caused to make contact with the lower surfaces of the bases 11A (metal layer 13), and distal end surfaces of second welding electrodes 82 are caused to make contact with the upper surfaces of the connecting portions 22A. Next, a voltage is applied between the unit lead frames 10A and 20A through the first welding electrodes 81 and the second welding electrodes 82 under a state in which the unit lead frames 10A and 20A are sandwiched and pressed by the first welding electrodes 81 and the second welding electrodes 82. According to this, resistive heat is generated at contacting portions of the lower surfaces of the connecting portions 22A and the upper surfaces of the connecting portions 11B. As a result, as illustrated in FIG. 10B, alloy layers 33 are formed in the contacting portions, and the second wirings 22 and the electrodes 11 are bonded to each other by fused bonding. In the case of such resistance welding, the openings 22X and the grooves 11X as illustrated in FIG. 6A do not need to be formed.

In the above embodiment, after having separated the structure body illustrated in FIG. 7B into respective substrates 1, the light emitting elements 40 are mounted on the metal layer 24 of the substrate 1. Not being limited to this, for example, the light emitting elements 40 may be mounted on the metal layer 24 of each unit lead frame 20A before separating into the respective substrates 1. In this case, the independent light emitting devices 2 may be obtained by cutting along the dicing positions D1 after having encapsulated the light emitting elements 40 by the encapsulating resin 50. The method for manufacturing the light emitting device 2 will now be described below.

Figure 11A:
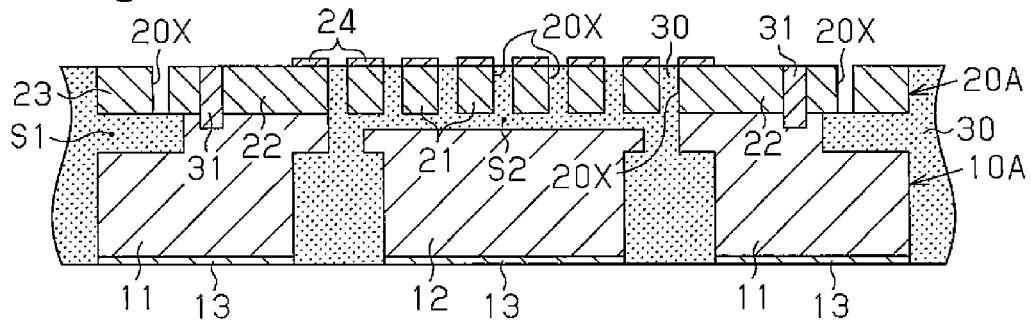
FIGS. 11A to 11D are schematic cross-sectional views illustrating a method for manufacturing a substrate of a modified example.

Firstly, by performing the manufacturing steps illustrated in FIGS. 3A to 6D, the structure body illustrated in FIG. 11A is obtained. The structure body illustrated in FIG. 11A includes the structure body of a plurality of substrates 1 before the separation into pieces.

Figure 11B:
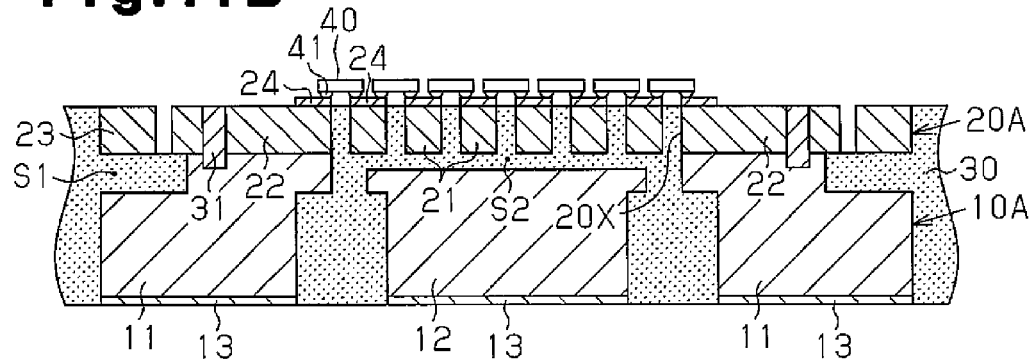

Next, in the step illustrated in FIG. 11B, the light emitting elements 40 are mounted, by flip-chip-bonding, on the metal layers 24 formed on the upper surfaces of the first and second wirings 21 and 22 of each unit lead frame 20A. Subsequently, in the step illustrated in FIG. 11C, an entirety of the surface onto which the light emitting elements 40 and the like are mounted is encapsulated by the encapsulating resin 50 by the collective molding scheme. Although not illustrated, in this step, the structure body illustrated in FIG. 11B may for example be mounted on the lower mold, and the structure body is sandwiched from above by the upper mold. Then, the structure body of FIG. 11B is heated and pressurized while injecting insulating resin in the corresponding resin filling region 61 (see FIG. 5C) from the mold gate portion (not illustrated). As the encapsulating means, for example, transfer mold is used.

Figure 11C:
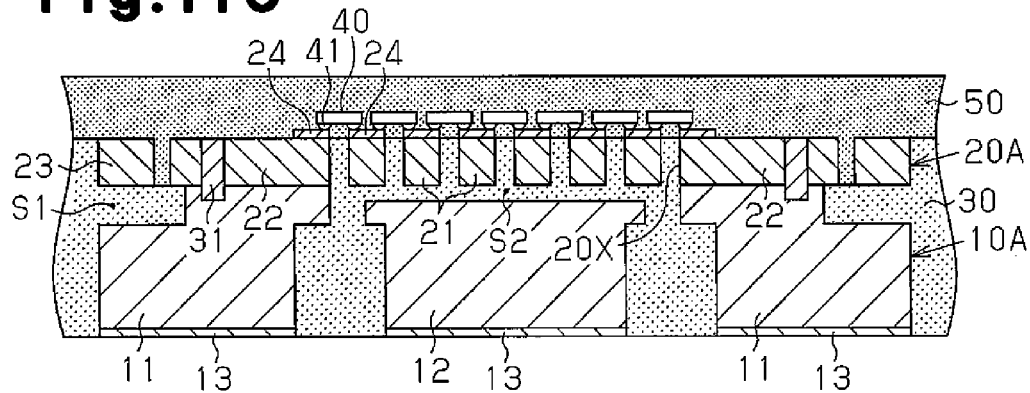
Figure 11D:
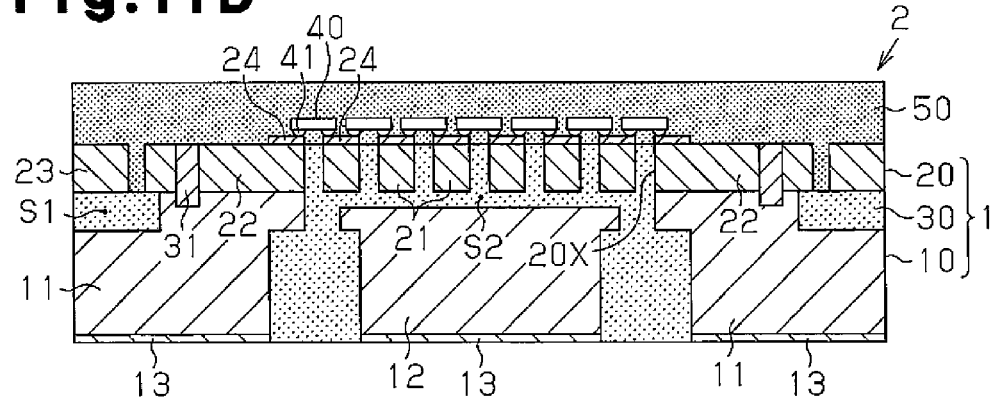

Thereafter, the structure body illustrated in FIG. 11C is cut along the dicing positions D1 (see FIG. 7B) by the dicer, router, and the like. According to this, as illustrated in FIG. 11D, the structure body of FIG. 11C is separated into the respective light emitting devices 2, and a plurality of light emitting devices 2 are manufactured.

According to such a manufacturing method, the formation of the encapsulating resin 50 is performed by the collective molding scheme. Therefore, manufacturing cost may be reduced.

Figure 12:
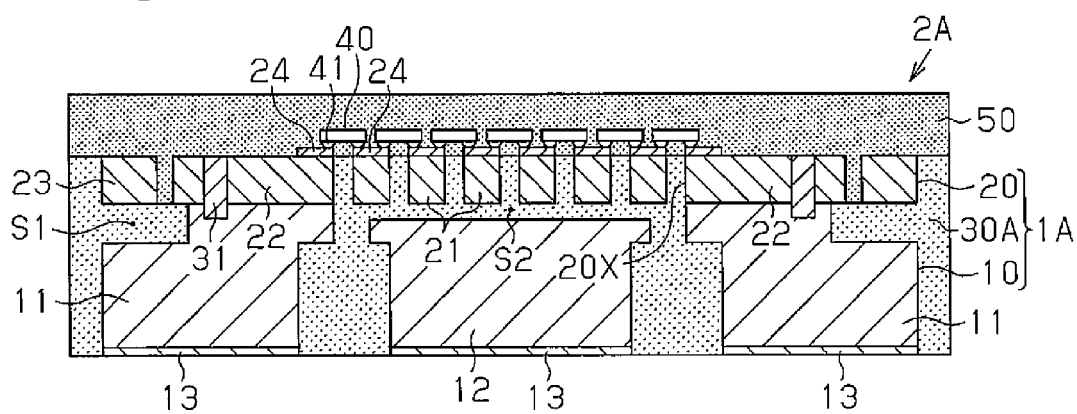
FIG. 12 is a schematic cross-sectional view illustrating a light emitting device of a modified example.

In the substrate 1 and the light emitting device 2 of the above embodiment, the outer circumferential surfaces of the electrodes 11 and the outer surface of the frame portion 23 are formed to be in the same plane as the outer surface of the resin layer 30 positioned on the outer surface of the substrate 1. Alternatively, as illustrated for example in FIG. 12, a resin layer 30A may be formed to cover the outer surfaces of the electrodes 11 and the outer surface of the frame portion 23. In this case, the encapsulating resin 50 is formed on the upper surface of the second lead frame and the upper surface of the resin layer 30A so as to encapsulate the light emitting elements 40 and the like. The substrate 1A and the light emitting device 2A as illustrated in FIG. 12 may easily be obtained by, for example, offsetting the dicing positions D1 illustrated in FIG. 7B to outside of the electrodes 11 and the frame portion 23.

In the above embodiments and the modified examples, the collective molding scheme that collectively performs resin filling and resin encapsulating to a plurality of substrates 1 (light emitting devices 2) is employed for the formation of the resin layer 30 and the formation of the encapsulating resin 50. Instead of this collective molding scheme, an independent molding scheme that performs the resin filling and the resin encapsulating to each of the substrates 1 (light emitting devices 2) may be employed.

In the step of removing the coupling portions 74 in the above embodiments (see FIGS. 7A and 7B), the frame portion 23 may be removed together with the coupling portions 74.

In the first lead frame 10 of the above embodiments, the metal layer 13 is formed on the entire lower surfaces of the bases 11A of the electrodes 11 and the entire lower surface of the base 12A of the heat sink 12. Alternatively, for example, the metal layer 13 may be formed on an entire surface of the first lead frame 10. As a material of the metal layer 13 in this case, for example, nickel, nickel alloy, silver, or silver alloy may be used.

In the second lead frame 20 of the above embodiments, the metal layer 24 is formed on the entire upper surfaces of the first wirings 21 and a part of the upper surfaces of the second wirings 22. Alternatively, the metal layer 24 may for example be formed on an entire upper surface of the second lead frame 20. That is, the metal layer 24 may be formed on the entire upper surfaces of the first wirings 21, the entire upper surfaces of the second wirings 22, and the entire upper surface of the frame portion 23.

The heat sink 12 in the above embodiments may be omitted.

In the above embodiments, the light emitting elements 40 are mounted on the substrate 1 by flip-chip-bonding, however, alternatively, the light emitting elements 40 may be mounted on the substrate 1 for example by wire bonding.

In the Zener diodes 28 of the above embodiments, the electrodes 28A are formed on the Zener diode chip lower surfaces, and the electrodes 28B are formed on the Zener diode chip upper surfaces. Alternatively, for example, two electrodes may be formed on the Zener diode chip upper surfaces. In this case, the Zener diode chip lower surface is adhered to one of the upper surfaces of the extended portions 22B opposing to one another by an adhesive, and the two electrodes on the Zener diode chip upper surface are electrically connected respectively with the upper surfaces of the two extended portions 22B by wire bonding.

Alternatively, the Zener diode chip lower surface may be adhered to the upper surface of the resin layer 30 formed between the distal ends of the two extended portions 22B opposing to one another, by an adhesive. In this case also, the two electrodes on the Zener diode chip upper surface are electrically connected respectively with the upper surfaces of the two extended portions 22B by wire bonding.

The Zener diodes 28 in the above embodiments may be omitted. For example, the Zener diodes 28 may be omitted in a case where breakdown of the light emitting elements 40 by static electricity does not need to be considered. In this case, the formation of the metal layer 24 on the upper surfaces of the distal ends of the extended portions 22B may be omitted.

In the above embodiments, the metal layers 13 and 24 are formed by electrolytic plating method. Alternatively, for example, the metal layers 13 and 24 may be formed by electroless plating.

The planar shapes of the grooves 11X and the openings 22X in the above embodiments are not limited to a round shape, but may for example be an oval shape, a rectangular shape, or a polygonal shape such as a pentagonal or hexagonal shape.

The planar shapes of the substrate 1 and the light emitting device 2 in the above embodiments are not limited to the rectangular shape, but may for example be a triangular shape or a polygonal shape such as pentagonal shape or more, and may also be a round shape.

In the substrate 1 of the above embodiments, the light emitting elements 40 are arranged in the matrix when viewed from above, however, the arranging configuration of the light emitting elements 40 is not particularly limited.

The number of the light emitting elements 40 to be mounted on the substrate 1 in the above embodiments is not particularly limited.

Figure 13A:
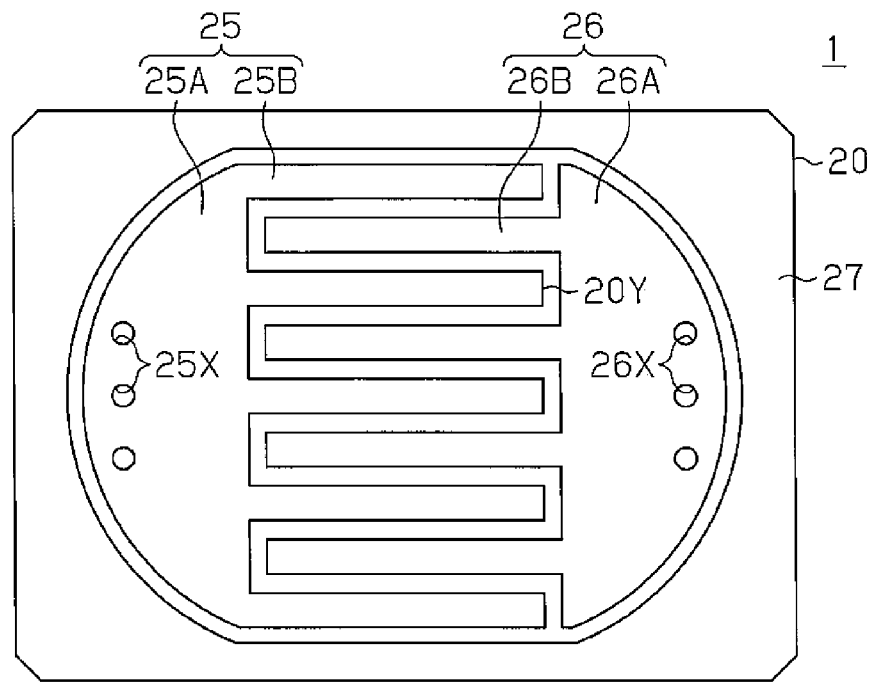
FIG. 13A is a schematic plan view illustrating a substrate of a modified example.

The shapes of the first wirings 21 and the second wirings 22 as well as the shape of the electrodes 11 in the above embodiments are also not particularly limited. For example, the shapes of the first wirings 21 and the second wirings 22 may be changed to shapes illustrated in FIG. 13A. The second lead frame 20 of FIG. 13A includes a pair of wirings 25 and 26, and a frame portion 27 formed so as to surround the wirings 25 and 26. The wiring 25 includes a connecting portion 25A formed in a semi-oval shape when viewed from above, and a plurality (five in FIG. 13A) of comb-shaped leads 25B extending toward inside from the connecting portion 25A. The wiring 26 includes a connecting portion 26A formed in a semi-oval shape when viewed from above, and a plurality (four in FIG. 13A) of comb-shaped leads 26B extending toward inside from the connecting portion 26A. The pairs of wirings 25 and 26 are arranged so that their leads 25B and 26B are positioned alternately. In this case, an opening 20Y in a shape of a substantial letter "W" being continued when viewed from above is formed between the wiring 25 and the wiring 26. Further, the pairs of wirings 25 and 26 are electrically separated from one another by the opening 20Y. Openings 25X for joining with one of the pair of electrodes 11 (see FIGS. 1A and 1B) are formed in the connecting portion 25A of the wiring 25, and openings 26X for joining with the other of the pair of electrodes 11 are formed in the connecting portion 26A of the wiring 26.

Figure 13B:
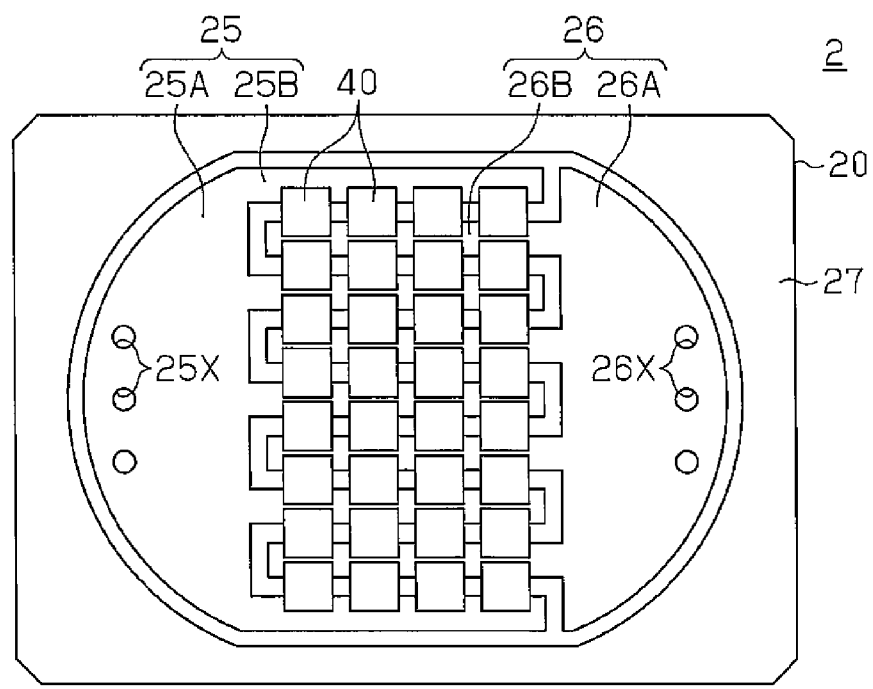
FIG. 13B is a schematic plan view illustrating the light emitting device of the modified example of FIG. 13B.

FIG. 13B illustrates an example of mounting a plurality of light emitting elements 40 on the substrate 1 having the wirings 25 and 26. Each light emitting element 40 is flip-chip-bonded with the leads 25B and 26B by crossing over the opening 20Y. That is, one of the two bumps 41 of the light emitting element 40 is flip-chip-bonded with the lead 25B, and the other bump 41 is flip-chip-bonded with the lead 26B. Further, the plurality of light emitting elements 40 are arranged on the leads 25B and 26B in a matrix (8×4 in FIG. 13B). Therefore, the light emitting elements 40 are connected to on another serially and in parallel. In this case also, similar to the second wirings 22 of the above embodiments, similar effects as the above embodiments may be obtained by the wirings 25 and 26 being joined with the electrodes 11.

[Mounting Example of Light Emitting Device]

Figure 14:
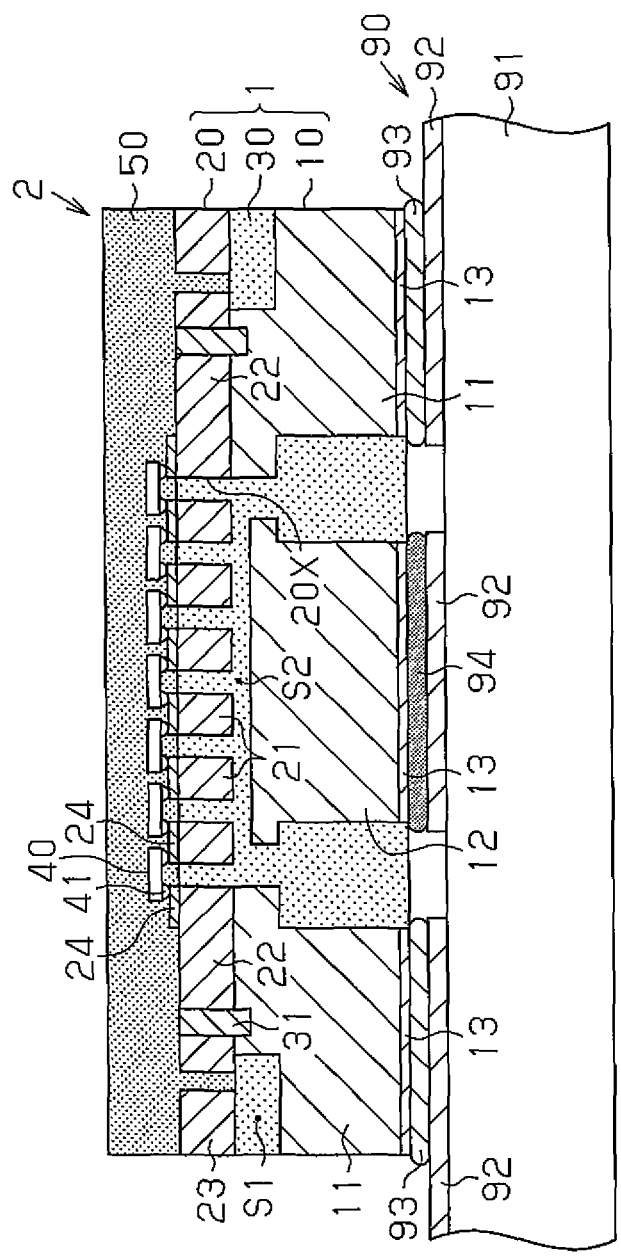
FIG. 14 is a schematic cross-sectional view illustrating an implemented example of a light emitting device of a modified example.

FIG. 14 illustrates an adapted example of the light emitting device 2 formed by mounting the light emitting elements 40 on the substrate 1 of the above embodiments. The light emitting device 2 is mounted on a mounting substrate 90.

The mounting substrate 90 includes a resin substrate 91 and a wiring layer 92. The light emitting device 2 is mounted on the wiring layer 92. For example, the metal layer 13 formed on the lower surfaces of the electrodes 11 are joined with the wiring layer 92 by solders 93. At this time, the metal layer 13 is exposed at a surface (lower surface in FIG. 14) opposite from the surface onto which the light emitting elements 40 are mounted. Accordingly, the electrodes 11 and the wiring layer 92 may be joined to one another so that the metal layer 13 is made to oppose to the wiring layer 92 of the mounting substrate 90. The electrodes 11 and the wiring layer 92 are electrically connected to each other via the solders 93. Further, in this case, the heat sink 12 is thermally connected with the wiring layer 92 for heat release via a heat conducting member 94. As the heat conducting member 94, for example, substances with high heat conduction such as indium (In), silicone (or hydrocarbon) grease, metal fillers, or graphite being formed in a sheet shape by resin binders may be used.

According to such a configuration, the first wirings 21 and the second wirings 22 onto which the light emitting elements 40 are mounted are connected to the wiring layer 92 of the mounting substrate 90 via the electrodes 11. Further, the heat sink 12 positioned below the first wirings 21 is thermally connected to the wiring layer 92 of the mounting substrate 90 via the heat conducting member 94. Due to these, the heat generated from the light emitting elements 40 may efficiently be released to the wiring layer 92.

The invention claimed is:

1. A substrate comprising:
   a first lead frame including a heat sink and a plurality of electrodes for external connection;
   a second lead frame laminated on the first lead frame and including a plurality of wirings for mounting light emitting elements; and
   a resin layer filled between the first lead frame and the second lead frame,
   wherein the plurality of wirings are arranged above the heat sink,
   the plurality of electrodes and part of the plurality of wirings are joined with each other,
   the plurality of wirings of the second lead frame includes:
      a plurality of first wirings including connecting portions with the light emitting elements; and
      a pair of second wirings including connecting portions with the electrodes and the light emitting elements,
   the plurality of first wirings are arranged adjacent to one another in parallel between the pair of second wirings,
   upper surfaces of the first wirings and upper surfaces of the second wirings serve as mounting portions for the light emitting elements, and
   lower surfaces of the second wirings serve as connecting portions with the electrodes.

2. The substrate according to claim 1, wherein
   the resin layer is filled between the first lead frame and the second lead frame, between the first wirings, between the second wirings, between the first wirings and the second wirings, and between the heat sink and the electrodes,
   the upper surfaces of the first wirings and the upper surfaces of the second wirings are exposed from an upper surface of the resin layer, and
   lower surfaces of the electrodes and a lower surface of the heat sink are exposed from a lower surface of the resin layer.

3. The substrate according to claim 1, wherein
   the resin layer includes an upper surface flush with the upper surfaces of the first wirings and the upper surfaces of the second wirings, and a lower surface flush with lower surfaces of the electrodes and a lower surface of the heat sink.

4. The substrate according to claim 1, wherein
the first lead frame includes:
a pair of the electrodes; and
the heat sink arranged between the pair of electrodes,
upper surfaces of the electrodes serve as connecting portions with the lower surfaces of the second wirings, and
lower surfaces of the electrodes exposed from a lower surface of the resin layer serve as connecting portions with an external substrate.

5. The substrate according to claim 1, further comprising an insulating layer formed between the first wirings that are not joined with the electrodes and the heat sink, wherein
the heat sink is arranged between the electrodes, and
the resin layer is also filled between the heat sink and the electrodes.

6. The substrate according to claim 1, wherein
the second lead frame includes a frame portion that surrounds the first wirings and the second wirings, and
the resin layer is also filled between the frame portion and the electrodes.

7. The substrate according to claim 1, further comprising:
a first metal layer that forms lower surfaces of the electrodes exposed from a lower surface of the resin layer; and
a second metal layer that forms the upper surfaces of the first wirings and the upper surfaces of the second wirings exposed from an upper surface of the resin layer.

8. The substrate according to claim 1, wherein the resin layer is a molded resin.

9. A light emitting device comprising:
a first lead frame including a heat sink and a plurality of electrodes for external connection;
a second lead frame laminated on the first lead frame and including a plurality of wirings;
a resin layer filled between the first lead frame and the second lead frame;
light emitting elements mounted on the wirings; and
an encapsulating resin formed to encapsulate the light emitting elements, wherein
the plurality of wirings is arranged above the heat sink,
the plurality of electrodes and part of the plurality of wirings are joined with each other,
the plurality of wirings of the second lead frame includes:
a plurality of first wirings including connecting portions with the light emitting elements; and
a pair of second wirings including connecting portions with the electrodes and the light emitting elements,
the plurality of first wirings are arranged adjacent to one another in parallel between the pair of second wirings,
upper surfaces of the first wirings and upper surfaces of the second wirings serve as mounting portions for the light emitting elements, and
lower surfaces of the second wirings serve as connecting portions with the electrodes.

10. A substrate comprising:
a first lead frame including a heat sink and a plurality of electrodes for external connection;
a second lead frame laminated on the first lead frame and including a plurality of wirings for mounting light emitting elements;
a resin layer filled between the first lead frame and the second lead frame;
a first metal layer that forms lower surfaces of the electrodes exposed from a lower surface of the resin layer; and
a second metal layer that forms upper surfaces of the wirings exposed from an upper surface of the resin layer,
wherein the plurality of wirings are arranged above the heat sink, and
the plurality of electrodes and part of the plurality of wirings are joined with each other.

11. The substrate according to claim 10, wherein
the resin layer is filled between the first lead frame and the second lead frame, between the wirings, and between the heat sink and the electrodes,
the upper surfaces of the wirings are exposed from the upper surface of the resin layer, and
the lower surfaces of the electrodes and a lower surface of the heat sink are exposed from the lower surface of the resin layer.

12. The substrate according to claim 10, wherein
the upper surface of the resin layer is flush with the upper surfaces of the wirings, and
the lower surface of the resin layer is flush with the lower surfaces of the electrodes and a lower surface of the heat sink.

13. The substrate according to claim 10, wherein
the first lead frame includes:
a pair of the electrodes; and
the heat sink arranged between the pair of electrodes,
upper surfaces of the electrodes serve as connecting portions with the part of the plurality of wirings, and
the lower surfaces of the electrodes exposed from the lower surface of the resin layer serve as connecting portions with an external substrate.

14. The substrate according to claim 10, further comprising an insulating layer formed between the other part of the plurality of wirings that is not joined with the electrodes and the heat sink, wherein
the heat sink is arranged between the electrodes, and
the resin layer is also filled between the heat sink and the electrodes.

15. The substrate according to claim 10, wherein
the second lead frame includes a frame portion that surrounds the wirings, and
the resin layer is also filled between the frame portion and the electrodes.

16. The substrate according to claim 10, wherein the resin layer is a molded resin.

17. A light emitting device comprising:
a first lead frame including a heat sink and a plurality of electrodes for external connection;
a second lead frame laminated on the first lead frame and including a plurality of wirings;
a resin layer filled between the first lead frame and the second lead frame;
light emitting elements mounted on the wirings;
an encapsulating resin formed to encapsulate the light emitting elements;
a first metal layer that forms lower surfaces of the electrodes exposed from a lower surface of the resin layer; and
a second metal layer that forms upper surfaces of the wirings exposed from an upper surface of the resin layer, wherein
the plurality of wirings are arranged above the heat sink, and the plurality of electrodes and part of the plurality of wirings are joined with each other.

* * * * *